(12) United States Patent
Park et al.

(10) Patent No.: US 11,449,163 B2
(45) Date of Patent: Sep. 20, 2022

(54) DISPLAY DEVICE

(71) Applicant: Samsung Display Co., Ltd., Yongin-si (KR)

(72) Inventors: Jong Seon Park, Wonju-si (KR); Dong Jin Moon, Cheonan-si (KR); Ye Ri Jeong, Suwon-si (KR); Hwan Hee Jeong, Cheonan-si (KR); In Young Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 17 days.

(21) Appl. No.: 16/891,001

(22) Filed: Jun. 2, 2020

(65) Prior Publication Data

US 2021/0109616 A1    Apr. 15, 2021

(30) Foreign Application Priority Data

Oct. 11, 2019 (KR) .................. 10-2019-0126352

(51) Int. Cl.
*G06F 3/041* (2006.01)
*H01L 27/32* (2006.01)
*G06F 3/044* (2006.01)

(52) U.S. Cl.
CPC .......... *G06F 3/0412* (2013.01); *G06F 3/044* (2013.01); *G06F 3/0416* (2013.01); *H01L 27/323* (2013.01); *H01L 27/3223* (2013.01); *H01L 27/3246* (2013.01)

(58) Field of Classification Search
None
See application file for complete search history.

(56) References Cited

U.S. PATENT DOCUMENTS

| 9,116,564 B2 | 8/2015 | Yun |
| 2017/0249039 A1* | 8/2017 | Kim .................. G06F 3/047 |
| 2018/0074553 A1* | 3/2018 | Yamazaki ........... H01L 51/0097 |
| 2018/0097044 A1* | 4/2018 | Choi .................... G09G 3/3225 |

FOREIGN PATENT DOCUMENTS

| KR | 10-2014-0010800 | 1/2014 |
| KR | 10-2014-0037530 | 3/2014 |

* cited by examiner

*Primary Examiner* — Stephen T. Reed
(74) *Attorney, Agent, or Firm* — H.C. Park & Associates, PLC

(57) ABSTRACT

A display device includes: a display panel having a display area and a non-display area at least partially disposed around the display area; and a touch sensor disposed on the display panel and including a touch sensor area and a touch pad area adjacent to the touch sensor area, wherein the touch sensor includes a plurality of touch electrodes disposed in the touch sensor area, a plurality of touch pads disposed in the touch pad area, and a plurality of touch signal lines electrically connecting the touch electrodes with the touch pads, respectively. The touch signal lines include first line portions overlapping with the touch pads and extending in a second direction intersecting the first direction, and the second line portions being angled relative to the respective first line portions extending in the first direction and connected to the touch electrodes, and the first line portion of the touch signal line has a first length in the second direction different from a second length in the second direction of a first line portion of an adjacent touch signal line.

29 Claims, 24 Drawing Sheets

DISPLAY DEVICE

CROSS REFERENCE TO RELATED APPLICATION

This application claims priority from and the benefit of Korean Patent Application No. 10-2019-0126352, filed on Oct. 11, 2019, which is hereby incorporated by reference for all purposes as if fully set forth herein.

BACKGROUND

Field

Exemplary implementations of the invention relate generally to a display device and, more particularly, to a display device having a touch sensor that minimizes the visibility of touch lines from outside of the device.

Discussion of the Background

Electronic devices that represent images to a user such as a smart phone, a tablet PC, a digital camera, a laptop computer, a navigation device and a television (TV) include a display device for displaying images. Such a display device includes a display panel for generating and displaying images and various input means.

Recently, a touch sensing unit that recognizes a touch input has been widely employed for the input means of a display device for a smartphone or a tablet PC. The touch sensing unit determines whether a user's touch input is received, and, if any, finds the coordinates of the position of the touch input.

The above information disclosed in this Background section is only for understanding of the background of the inventive concepts, and, therefore, it may contain information that does not constitute prior art.

SUMMARY

Applicant discovered that touch lines of the touch sensing unit may be visible to users of the display device during operation when the display device displays images.

Display devices including touch sensors constructed according to the principles and exemplary implementations of the invention are capable of minimizing the external visibility of touch lines disposed in the touch sensor, thereby improving image quality of the display devices.

Additional features of the inventive concepts will be set forth in the description which follows, and in part will be apparent from the description, or may be learned by practice of the inventive concepts.

According to an aspect of the invention, a display device includes a display panel having a display area and a non-display area at least partially disposed around the display area; and a touch sensor disposed on the display unit and including a touch sensor area and a touch pad area adjacent to the touch sensor area, wherein the touch sensor includes a plurality of touch electrodes disposed in the touch sensor area, a plurality of touch pads disposed in the touch pad area, and a plurality of touch signal lines electrically connecting the touch electrodes with the touch pads, respectively. The touch signal lines comprise first line portions overlapping the touch pads and extending in a second direction intersecting the first direction, and the second line portions being angled relative to the respective first line parts extending in the first direction and connected to the touch electrodes. The first line portion of the touch signal line has a first length in the second direction different from a second length in the second direction of a first line portion of an adjacent touch signal line.

The lengths of the first line portions in the second direction gradually may increase along the first direction towards the side edge of the touch pad area.

The widths of adjacent ones of the first line portions in the first direction may be substantially equal to each other The touch sensor may include at least one dummy electrode disposed between adjacent ones of the touch signal lines.

The dummy electrodes may be disposed between adjacent ones of the first line portions.

A first distance between adjacent ones of the first line portions may be greater than a second distance between adjacent ones of the second line portions.

The at least one dummy electrode may include a plurality of dummy electrodes, and the dummy electrodes are arranged along a direction in which the first line portions may extend.

The numbers of the dummy electrodes of the array of dummy electrodes may be gradually increased along the first direction towards the side edge of the touch pad area.

Each of the dummy electrodes may be aligned with adjacent ones of the second line portions along the first direction.

Each of the first line portions may include a plurality of openings arranged along a direction in which the first line parts are extended, and the each of the openings may be aligned with the adjacent one of the second line parts along the first direction.

The first line portion may include a first subsidiary line portion and a second subsidiary line portion adjacent to the first subsidiary line portion in the second direction, the first subsidiary line portion may protrude from the second subsidiary line portion in the first direction, and the first subsidiary line portion may be aligned with the adjacent second line portion in the first direction.

The first line portions may be physically separated from the second line portions, and the touch sensing unit may further include a connection electrode electrically connecting the touch pads with the second line portions, respectively.

The connection electrode may be disposed in the same layer as the touch pad.

The touch sensing unit may further include a dummy metal line aligned with the second line portion along the first direction and electrically separated from the second line portion.

The connection electrode may be physically connected to the touch pads.

The display device may further include: a first insulating layer disposed between the first line portions and the touch pads, the touch pads may be electrically connected to the first line portions through contact holes formed in the first insulating layer, each of the first line portions may include a metal opening formed in the each of the first line parts, and the touch pads may overlap the metal openings, respectively.

The touch signal lines may include first line portions having a serpentine shape overlapping the touch pads, and second line portions angled relative to respective first line portions extending in the first direction and connected to the touch electrodes, and lengths of the first line portions increase gradually along the first direction towards the side edge of the touch pad area.

According to another aspect of the invention, a display device includes: a display panel having a display area and a non-display area disposed at least partially around the display area; and a touch sensor disposed on the display panel and including a touch sensor area and a touch pad area adjacent to the touch sensor area, wherein the touch sensor includes a plurality of touch electrodes disposed in the touch sensor area, a plurality of touch pads arranged in the touch pad area in a first direction, and a plurality of touch signal lines electrically connecting the touch electrodes with the touch pads, respectively, and wherein the touch sensing unit includes a dummy electrode having an dummy opening disposed between adjacent ones of the touch signal lines in a form of a continuous plate, and the dummy opening may penetrate through it from the surface of the dummy electrode in the thickness direction.

The touch signal lines may include first line portions overlapping the touch pads and extending in a second direction intersecting the first direction, and second line portions may be inclined relative to the first line portions extending along the first direction and connected to the touch electrodes.

The dummy electrode may be disposed between adjacent ones of the first line portions, more than one dummy opening may be formed, and the dummy openings may be arranged along a direction in which the first line portions extend.

According to still another aspect of the invention, a display device includes a display panel comprising a display area and a non-display area disposed at least partially around the display area; and a touch sensor disposed on the display panel and including a touch sensor area and a touch pad area adjacent to the touch sensor area, wherein the touch sensor includes a plurality of touch electrodes disposed in the touch sensor area, a plurality of touch pads disposed in the touch pad area, and a plurality of touch signal lines electrically connecting the touch electrodes with the touch pads, respectively, wherein the touch signal lines comprise a plurality of first touch signal lines, wherein the first touch signal lines comprise first line portions connected to the touch pads, and second lines portions are angled relative to the respective first line parts extending in the first direction and connected to the touch electrodes, wherein the first line portions comprise first subsidiary line portions overlapping with the touch pads, and second subsidiary line portions disposed between the first subsidiary line portions and the second line portions, and wherein the first subsidiary line portion of the first touch signal line has a first length substantially equal to a first length of a first subsidiary line portion of an adjacent first touch signal line.

The widths of adjacent ones of the second subsidiary line portions of the first touch signal lines may be substantially equal to each other.

The widths of adjacent ones of the second subsidiary line portions of the first touch signal lines may be different from each other, and widths of the second subsidiary line portions of the first touch signal lines may increase gradually along the second direction.

The second subsidiary line portions may have a stair-like shape.

The plurality of touch signal lines may include second touch signal lines, the second touch signal lines may include third line portions connected to the touch pads, and fourth line portions angled relative to the third line portions extending in the first direction and connected to the touch electrodes, the touch sensor may further include a plurality of dummy patterns, and the plurality of dummy patterns may have a shape substantially identical to that of the second subsidiary line portions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
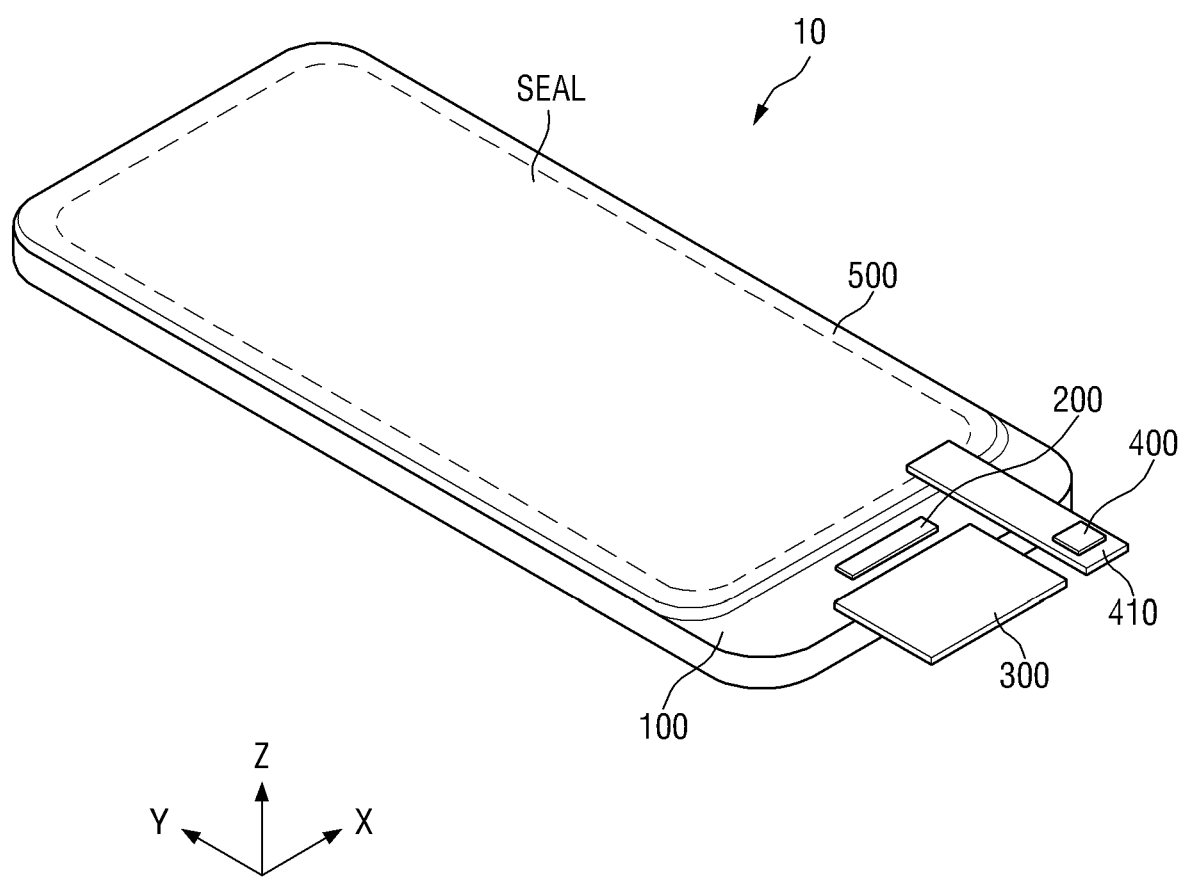
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the invention will be described with reference to the attached drawings.

Figure 2:
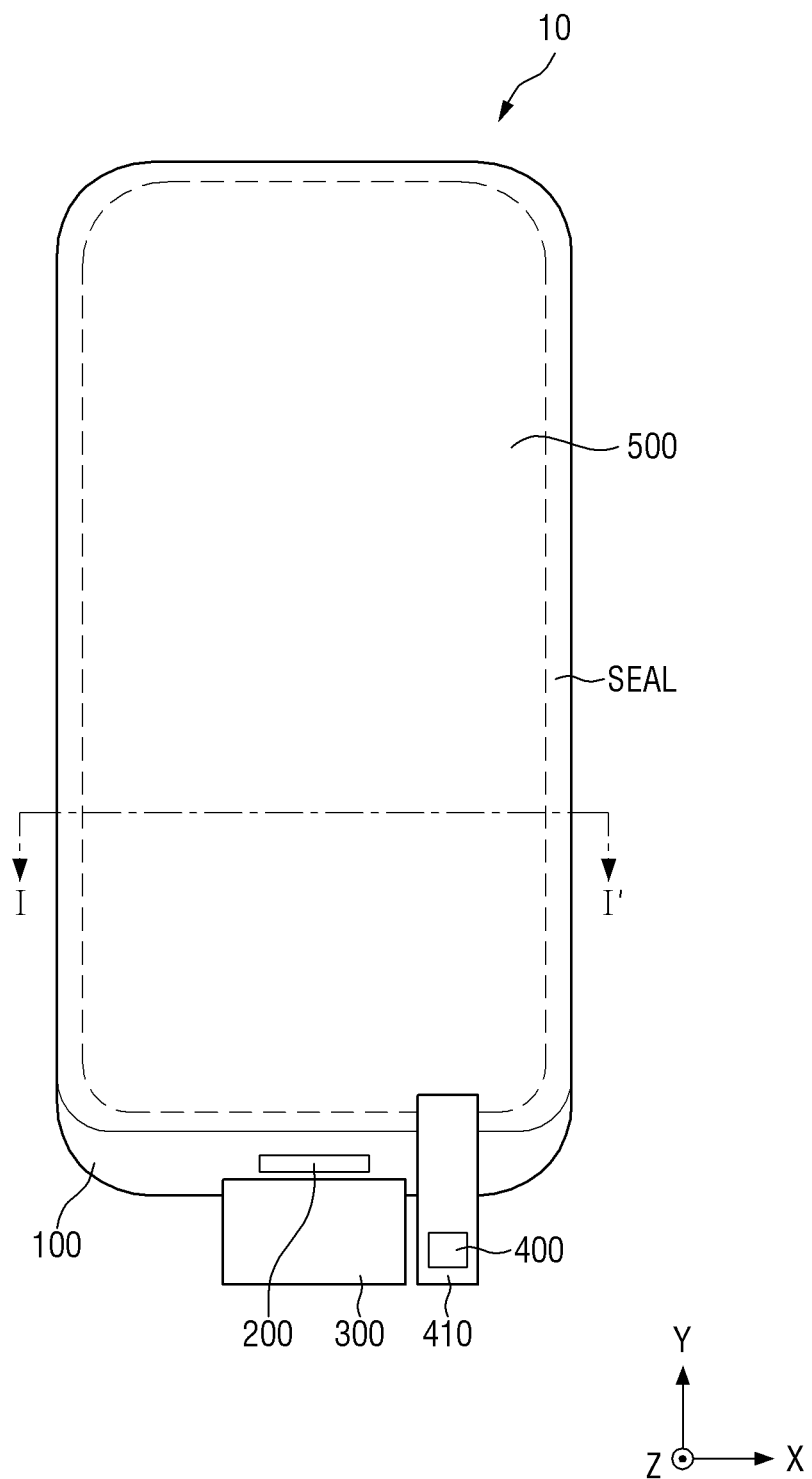
FIG. 2 is a plan view of an exemplary embodiment of a display device constructed according to the principles of the invention.

FIG. 1 is a perspective view of an exemplary embodiment of a display device constructed according to the principles of the invention. FIG. 2 is a plan view of an exemplary embodiment of a display device constructed according to the principles of the invention.

As used herein, the terms "above," "top" and "upper surface" refer to the side of the display panel 100 on which a touch sensing unit 500 is disposed, i.e., the side indicated by the arrow of the z-axis direction, whereas the terms "below," "bottom" and "lower surface" refer to the side of the touch sensing unit 500 on which the display panel 100 is disposed, i.e., the opposite side in the z-axis direction. As used herein, the terms "left," "right," "upper" and "lower" sides indicate relative positions when the display panel 100 is viewed from the top. For example, the "left side" refers to the opposite side indicated by the arrow of the x-axis direction, the "right side" refers to the side indicated by the arrow of the x-axis direction, the "upper side" refers to the direction indicated by the arrow of the y-axis direction, and the "lower side" refers to the opposite side indicated by the arrow of the y-axis direction.

Referring to FIGS. 1 to 2, a display device 10 is designed for displaying moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things (IoT) and the like. The display device 10 may be one of an organic light-emitting display device, a liquid-crystal display device, a plasma display device, a field emission display device, an electrophoretic display device, an electrowetting display device, a quantum dot light-emitting display device, a micro LED display device and the like. In the following description, an organic light-emitting display device is employed as the display device 10. It is, however, to be understood that the exemplary embodiments are not limited thereto.

According to an exemplary embodiment, a display device 10 includes a display panel 100, a display driving circuit 200, a display circuit board 300, a touch driving circuit 400, a touch circuit board 410 and a touch sensing unit (touch sensor) 500.

The display panel 100 may be formed in a rectangular plane having shorter sides in a first direction (x-axis direction) and longer sides in a second direction (y-axis direction) intersecting the first direction (x-axis direction). Each of the corners where the shorter side in the first direction (x-axis direction) meets the longer side in the second direction (y-axis direction) may be rounded with a predetermined curvature or may be a right angle. The shape of the display panel 100 when viewed from the top is not limited to a quadrangular shape, but may be formed in a different polygonal shape, a circular shape, or an elliptical shape.

The display panel 100 may be, but is not limited to being, formed to be substantially flat. The main area MA 10 may include curved portions formed at left and right ends thereof. The curved portions may have a constant curvature or varying curvatures. In addition, the display panel 100 may be formed to be flexible so that it can be curved, bent, folded or rolled.

The display panel 100 may include pixels disposed in a display area to display images, and display electrode pads disposed in a non-display area around the display area. The display electrode pads may be formed on the display panel 100 at one edge of the display panel 100 to be electrically connected to the display circuit board 300. The display panel 100 will be described in detail with reference to FIGS. 3 and 5.

The display driving circuit 200 outputs signals and voltages for driving the display panel 100. For example, the display driving circuit 200 may apply data voltages to the data lines. In addition, the display driving circuit 200 may apply supply voltage to the power line and may apply scan control signals to the scan driver. The display driving circuit 200 may be implemented as an integrated circuit (IC) and may be attached to the display panel 100 by a chip on glass (COG) technique, a chip on plastic (COP) technique, or an ultrasonic bonding. The display driving circuit 200 may be attached on the exposed part of display panel 100 that is not covered by the touch sensing unit 500. Alternatively, the display driving circuit 200 may be mounted on the circuit board 300.

The display circuit board 300 may be attached on the display electrode pads of the display panel 100 using an anisotropic conductive film. Accordingly, the lead lines of the display circuit board 300 may be electrically connected to the display electrode pads of the display panel 100. The display circuit board 300 may be a flexible printed circuit board, a printed circuit board, or a flexible film such as a chip on film.

The touch sensing unit 500 may be disposed on the display panel 100. The touch sensing unit 500 may be formed as a rectangular plane having the shorter sides in the first direction (x-axis direction) and the longer sides in the second direction (y-axis direction). Each of the corners where the shorter side in the first direction (x-axis direction) meets the longer side in the second direction (y-axis direction) may be rounded with a predetermined curvature or may be a right angle. The shape of the touch sensing unit 500 when viewed from the top is not limited to a quadrangular shape, but may be formed in other polygonal shapes, a circular shape, or an elliptical shape. The shape of the touch sensing unit 500 may be similar to the shape of the display panel 100 when viewed from the top.

The touch sensing unit 500 may be, but is not limited to being, flat. The touch sensing unit 500 may include curved portions formed at left and right ends thereof. The curved portions may have a constant curvature or varying curvatures. In addition, the touch sensing unit 500 may be formed to be flexible so that it can be curved, bent, folded or rolled, like the display panel 100.

The touch sensing unit 500 may include touch electrodes that are disposed in a touch sensor area and detect a user's touch, and touch electrode pads that are disposed in a touch peripheral area around the touch sensor area. The touch electrode pads may be formed on the touch sensing unit 500 at one edge of the touch sensing unit 500 to be electrically connected to the touch circuit board 410.

Figure 3:
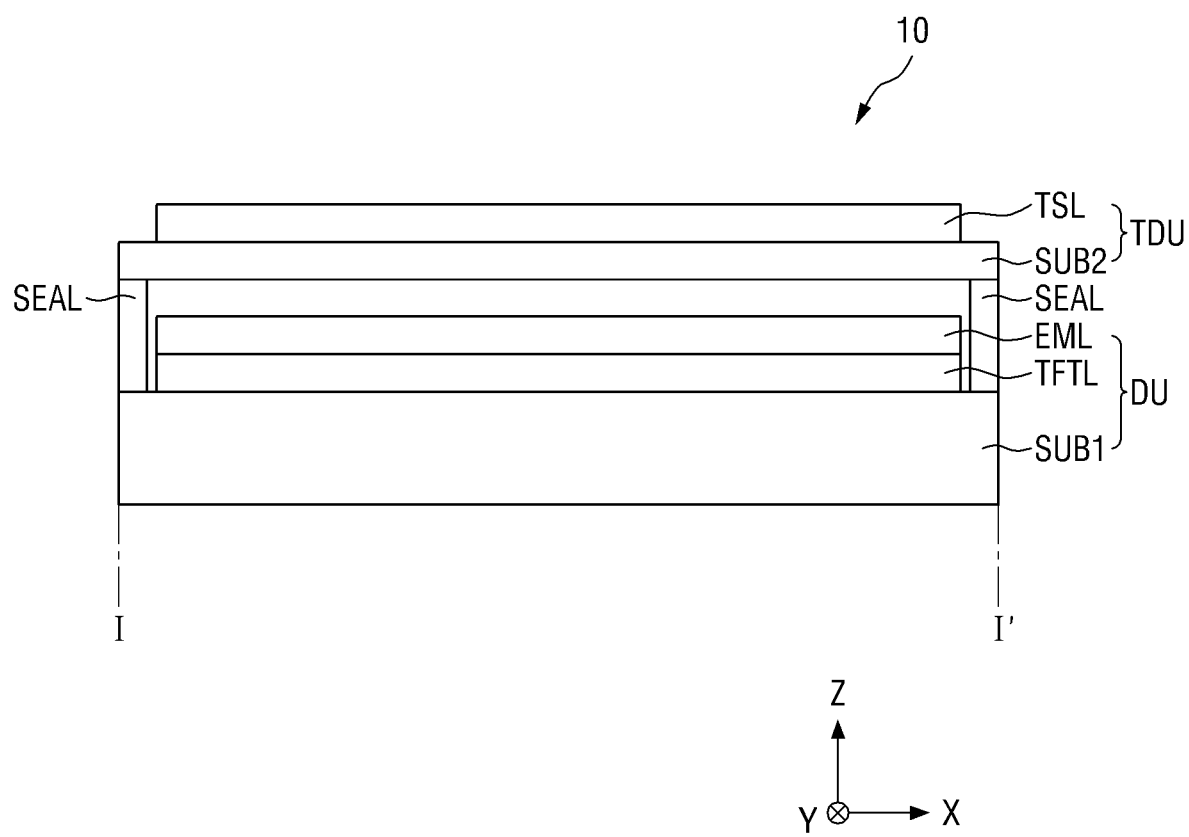
FIG. 3 is a cross-sectional view taken along line I-I' of FIG. 2.

The display device 10 may include a display unit (display panel) DU shown in FIG. 3, a touch sensing unit (touch sensor) TDU shown in FIG. 3, and an adhesive member SEAL that attaches the display unit DU to the touch sensing unit TDU. The adhesive member SEAL may attach a first substrate SUB1 shown in FIG. 3 of the display unit DU to a second substrate SUB2 shown in FIG. 3 of the touch sensing unit TDU.

As shown in FIGS. 1, 2 and 3, the adhesive member SEAL may be disposed on the touch sensing unit 500 and the edge of the display panel 100. That is to say, the adhesive member SEAL may be disposed along the border of the touch sensing unit 500 and the border of the display panel 100, and may be disposed more to the inside than the display driving circuit 200 and the circuit board 300 of the display panel 100 so that it does not overlap with them in the thickness direction. The adhesive member SEAL may partially overlap with the touch circuit board 410 in the thickness direction.

The touch sensing unit 500 will be described in detail with reference to FIGS. 3 and 5. Although the touch sensing unit 500 is a touch panel separated from the display panel 100 in the example shown in FIGS. 1 and 2, the exemplary embodiments is not limited thereto. For example, the touch sensing unit 500 may be formed directly on a thin-film encapsulation layer of the display panel 100.

The touch circuit board 410 may be attached onto the touch electrode pads of the touch sensing unit 500 using an anisotropic conductive film. Accordingly, the lead lines of the touch circuit board 410 may be electrically connected to the touch electrode pads of the touch sensing unit 500. The touch circuit board 410 may be a flexible printed circuit board, a printed circuit board, or a flexible film such as a chip-on film.

The touch driving circuit 400 may be connected to the touch electrodes of the touch sensing unit 500. The touch driving circuit 400 applies touch driving signals to the touch electrodes of the touch sensing unit 500 and measures capacitances of the touch electrodes. The touch driving signals may have driving pulses. The touch driving circuit 400 may not only determine whether a touch is input based on the capacitances, but also calculate touch coordinates of the position where the touch is input. The touch driving circuit 400 may be implemented as an integrated circuit (IC) and may be mounted on the touch circuit board 300.

FIG. 3 is a cross-sectional view taken along line I-I' of FIG. 2.

Referring to FIG. 3, the display device 10 may include a display unit DU, a touch sensing unit TDU, and an adhesive member SEAL that attaches the display unit DU to the touch sensing unit TDU.

The display unit DU (i.e., display panel 100 shown in FIGS. 1 and 2) may include a first substrate SUB1, a thin film transistor layer TFTL, and an emission material layer EML.

The first substrate SUB1 may be a rigid substrate or a flexible substrate that can be bent, folded, rolled, and so on. The first substrate SUB1 may be made of an insulating material such as glass, quartz and a polymer resin. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. Alternatively, the first substrate SUB1 may include a metal material.

Figure 4:
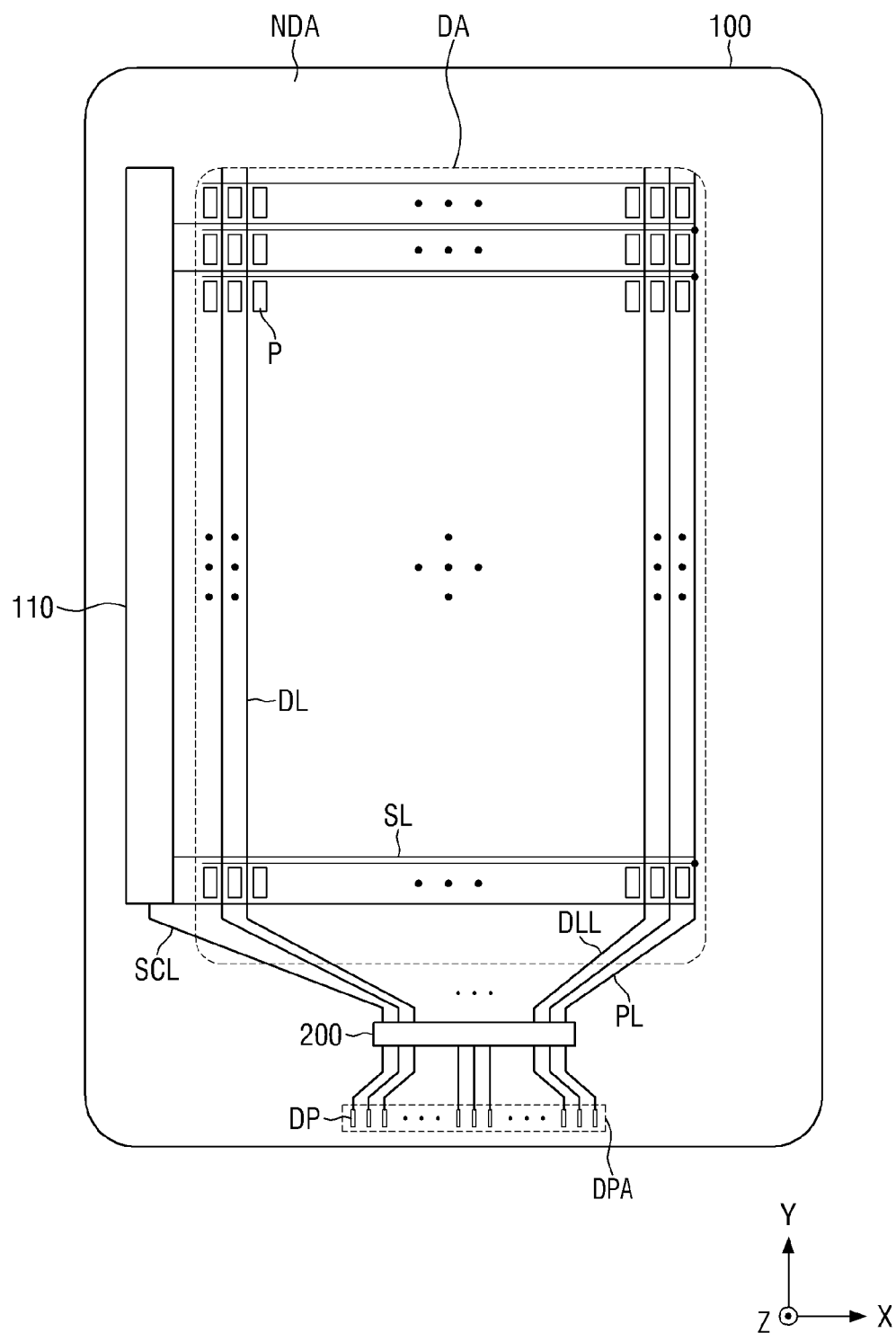
FIG. 4 is a plan view of an exemplary embodiment of the display unit (display panel) of FIG. 3 in detail.

The thin-film transistor layer TFTL may be disposed on the first substrate SUB1. On the thin-film transistor layer TFTL, scan lines, data lines, power lines, scan control lines, data connection lines for connecting the display driving circuit 200 with data lines, pad connection lines for connecting the display driving circuit 200 with the display electrode pads, etc., as well as thin-film transistors in each of the pixels. Each of the thin-film transistors may include a gate electrode, a semiconductor layer, a source electrode and a drain electrode. When the scan driver 110 is formed in the non-display area NDA of the display panel 100 as shown in FIG. 4, the scan driver 110 may include thin-film transistors.

The thin-film transistor layer TFTL may be disposed in the display area DA and the non-display area NDA. Specifically, the thin-film transistors in the pixels, the scan lines, the data lines, and the power lines on the thin-film film transistor layer TFTL may be disposed in the display area DA. The scan control lines, the data connection lines and the pad connection lines of the thin-film transistor layer TFTL may be disposed in the non-display area NDA.

The emission material layer EML may be disposed on the thin-film transistor layer TFTL. The emission material layer EML may include pixels in each of which a first electrode, an emissive layer and a second electrode are stacked on one another sequentially to emit light, and a bank layer for defining the pixels. The pixels on the emission material layer EML may be disposed in the display area DA.

The emissive layer may be an organic emissive layer containing an organic material. Then, the emissive layer may include a hole transporting layer, an organic light-emitting layer and an electron transporting layer. When a voltage is applied to the first electrode and a cathode voltage is applied to the second electrode through the thin-film transistor on the thin-film transistor layer TFTL, the holes and electrons move to the organic light-emitting layer through the hole transporting layer and the electron transporting layer, respectively, such that they combine in the organic light-emitting layer to emit light. In such case, the first electrode may be an anode electrode while the second electrode may be a cathode electrode.

The touch sensing unit TDU may include the second substrate SUB2 and a touch sensor layer TSL.

The second substrate SUB2 may be a rigid substrate or a flexible substrate that can be bent, folded, rolled, and so on. The second substrate SUB2 may be made of an insulating material such as glass, quartz and a polymer resin. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. Alternatively, the second substrate SUB2 may include a metal material. In addition, the second substrate SUB2 may serve as an encapsulation substrate that encapsulates the emission material layer EML.

The touch sensor layer TSL may be disposed on the second substrate SUB2. The touch sensor layer TSL may include touch electrodes for sensing a user's touch by capacitive sensing, touch electrode pads, and touch signal lines for connecting the touch electrode pads with the touch electrodes. For example, the touch sensor layer TSL can sense a user's touch by self-capacitive sensing or mutual capacitive sensing.

Figure 5:
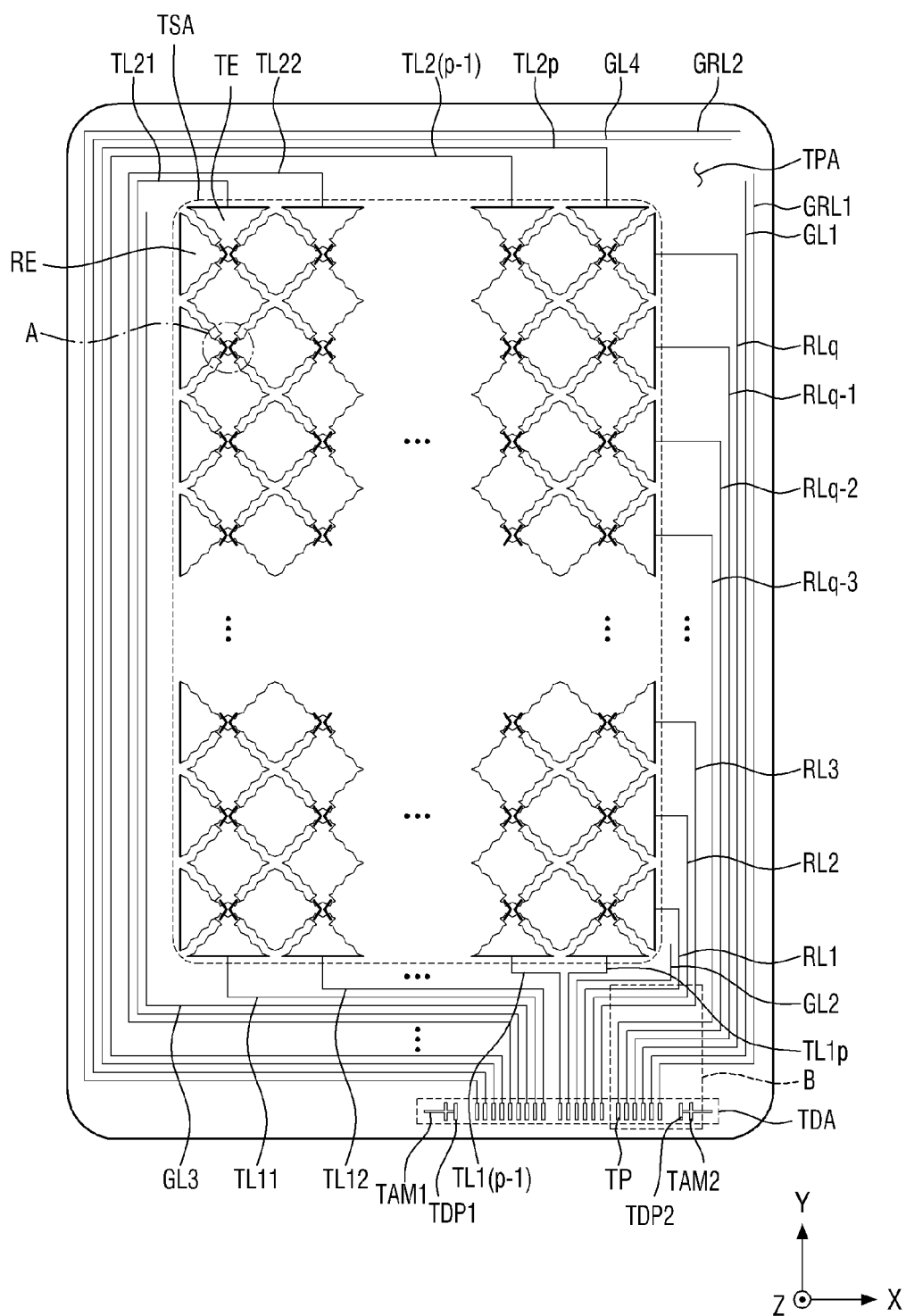
FIG. 5 is a plan view of an exemplary embodiment of the touch sensing unit (touch sensor) of FIG. 3 in detail.

As shown in FIG. 5, the touch electrodes of the touch sensor layer TSL may be disposed in the touch sensor area TSA overlapping the display area DA. The touch signal lines and the touch electrode pads of the touch sensor layer TSL may be disposed in the touch peripheral area TPA that overlaps the non-display area NDA. The touch peripheral area TPA may be disposed around the touch sensor area TSA.

A polarizing film and a cover window may be further disposed on the touch sensor layer TSL. The polarizing film may be disposed on the touch sensor layer TSL, and the cover window may be attached onto the polarizing film by a transparent adhesive member.

The adhesive member SEAL may attach a first substrate SUB1 of the display unit DU to a second substrate SUB2 of the touch sensing unit TDU. The adhesive member SEAL may be, but is not limited to, a frit adhesive layer, an ultraviolet curable resin, or a thermosetting resin.

Although there is a space between the emission material layer EML and the second substrate SUB2 in the example shown in FIG. 3, exemplary embodiments of the exemplary embodiments are not limited thereto. For example, a filler film may be disposed between the emission material layer EML and the second substrate SUB2. The filler film may be an epoxy filler film or a silicon filler film.

FIG. 4 is a plan view of an exemplary embodiment of the display unit (display panel) of FIG. 3 in detail. For convenience of illustration, FIG. 4 shows only the pixels P, the scan lines SL, the data lines DL, the power lines PL, the scan control lines SCL, the scan driver 110, the display driving circuit 200, the display electrode pads DP, the data connection lines DLL and the pad connection lines PLL of the display panel 100 (display unit DU).

Referring to FIG. 4, the display panel 100 may include a display area DA where pixels PX are formed to display images, and a non-display area NDA which is the peripheral area of the display area DA. The non-display area NDA may be defined as the area from the outer side of the display area DA to the edge of the display panel 100.

The scan lines SL, the data lines DL, the power line PL and the pixels P may be disposed in the display area DA. The scan lines SL may be arranged in the first direction (x-axis direction), while the data lines DL may be arranged in the second direction (y-axis direction) intersecting the first direction (x-axis direction). The power lines PL may include at least one line in parallel with the data lines DL in the second direction (y-axis direction) and a plurality of lines branching off from the at least one line in the first direction (x-axis direction).

Each of the pixels P may be connected to at least one of the scan lines SL, one of the data lines DL, and the power line PL. Each of the pixels P may include thin-film transistors including a driving transistor and at least one switching transistor, an organic light-emitting diode, and a capacitor. When a scan signal is applied from the scan line SL, each of the pixels P receives a data voltage of the data line DL and supplies a driving current to the organic light-emitting diode according to the data voltage applied to the gate electrode, so that light is emitted.

The scan driver 110, the display driving circuit 200, the scan control lines SCL, the data connection lines DLL and the pad connection lines PLL may be disposed in the display area DA.

The scan driver 110 is connected to the display driving circuit 200 through at least one scan control line SCL. Accordingly, the scan driver 110 may receive the scan control signal of the display driving circuit 200. The scan driver 110 generates scan signals according to a scan control signal and supplies the scan signals to the scan lines SL.

Although the scan driver 110 is formed in the non-display area NDA on an outer side of the display area DA in the example shown in FIG. 4, the exemplary embodiments are not limited thereto. For example, the scan driver 110 may be formed in the non-display area NDA on each outer side of the display area DA.

The display driving circuit 200 may be connected to the display electrode pads DP of the display pad area DPA through the display connection lines PLL to receive digital video data and timing signals. The display driving circuit 200 converts the digital video data into analog data voltages and supplies them to the data lines DL through the data connection lines DLL. In addition, the display driving circuit 200 generates and supplies a scan control signal for controlling the scan driver 110 through the scan control line SCL. The pixels P to which the data voltages are to be supplied may be selected by the scan signals of the scan driver 110 and the data voltages may be supplied to the selected pixels P. The display driving circuit 200 may be implemented as an integrated circuit (IC) and may be attached to the substrate SUB by a chip on glass (COG) technique, a chip on plastic (COP) technique, or an ultrasonic bonding.

FIG. 5 is a plan view of an exemplary embodiment of the touch sensing unit (touch sensor) TDU of FIG. 3 in detail.

Referring to FIG. 5, the touch sensing unit TDU includes a touch sensor area TSA for detecting (or sensing) a user's touch, and a touch peripheral area TPA disposed around the touch sensor area TSA. The touch sensor area TSA may overlap the display area DA of the display panel 100, and the touch peripheral area TPA may overlap the non-display area NDA of the display panel 100.

The touch sensor area TSA may have a rectangular shape when viewed from the top.

The first touch electrodes (or the first sensing electrodes) TE and the second touch electrodes (or the second sensing electrodes) RE may be disposed in the touch sensor area TSA. The first touch electrodes TE and the second touch electrodes RE may be spaced apart from each other. The first touch electrodes TE may be arranged in a plurality of columns in the second direction (Y-axis direction), while the second touch electrodes RE may be arranged in a plurality of rows in the first direction (X-axis direction). The first touch electrodes TE arranged in the second direction (Y-axis direction) may be electrically connected with one another in each of the columns. In addition, the second touch electrodes RE arranged in the first direction (X-axis direction) may be electrically connected to each other in each of the plurality of rows.

The first touch electrodes TE and the second touch electrodes RE may be disposed in the touch sensor area TSA. Each of the first touch electrodes TE and the second touch electrodes RE disposed on one side and the opposite side of the touch sensor area TSA in the first direction (X direction) and on one side and the opposite side of the touch sensor area TSA in the second direction (Y direction) may be formed in a diamond shape or a triangular shape when viewed from the top. In addition, in order to prevent moiré patterns by the first touch electrodes TE and the second touch electrodes RE when a user watches images on the display device 10, the first touch electrode TE and the second touch electrodes RE may have curved sides when viewed from the top. It is to be understood that the shape of the first touch electrodes TE and the second touch electrodes RE disposed in the touch sensor area TSA when viewed from the top is not limited to that shown in FIG. 5.

The first touch electrodes TE adjacent to each other in the second direction (Y-axis direction) may be electrically connected to each other through connection electrodes CE. In such case, in order to prevent a short-circuit from being formed at the intersections of the first touch electrodes TE and the second touch electrodes RE, the first touch electrodes TE and the second touch electrodes RE may be disposed on one layer, while the connection electrode BE may be disposed on a different layer from the first touch electrodes TE and the second touch electrodes RE. As a result, the first touch electrodes TE electrically connected in the second direction (Y-axis direction) and the second touch electrodes RE electrically connected in the first direction (X-axis direction) may be electrically insulated from each other.

First touch signal lines TL11 to TL1$p$, second touch signal lines TL21 to TL2$p$, third touch signal lines RL1 to RL$q$, and the touch electrode pads TP may be disposed in the touch peripheral area TPA, where $p$ and $q$ are positive integers equal to or greater than two.

One end of each of the first touch signal lines TL11 to TL1$p$ may be connected to the respective one of the first touch electrodes TE disposed on a first side of the touch sensor area TSA. The first side (e.g., a lower side shown in FIG. 5) of the touch sensor area TSA may refer to one of the four sides of the touch sensor area TSA that is closest to the touch pad area TDA where the touch electrode pads TP are disposed. The other end of each of the first touch signal lines TL11 to TL1$p$ may be connected to some of the touch electrode pads TP of the touch pad area TDA. That is to say, the first touch signal lines TL11 to TL1$p$ may connect the first touch electrodes TE disposed on the first side of the touch sensor area TSA with some of the touch electrode pads TP of the touch pad area TDA.

For example, as shown in FIG. 5, a (1-1) touch signal line TL11 may be electrically connected to the first touch electrodes TE disposed in the first column of the touch sensor area TSA, and a (1-2) touch signal line TL12 may be electrically connected to the first touch electrodes TE disposed in the second column of the touch sensor area TSA. In addition, a (1-(p-1)) touch signal line TL1($p$-1) may be electrically connected to the first touch electrodes TE disposed in the (p-1)$^{th}$ column of the touch sensor area TSA, and a (1-p) touch signal line TL1$p$ may be electrically connected to the first touch electrodes TE disposed in the p$^{th}$ column of the touch sensor area TSA. In such case, the first column of the touch sensor area TSA may refer to the leftmost column of the touch sensor area TSA, and the p$^{th}$ column of the touch sensor area TSA may refer to the rightmost column of the touch sensor area TSA.

One end of each of the second touch signal lines TL21 to TL2$p$ may be connected to the respective one of the first touch electrodes TE disposed on a second side of the touch sensor area TSA. The second side (e.g., an upper side shown in FIG. 5) of the touch sensor area TSA may refer to the opposite side to the first side of the touch sensor area TSA. The other end of each of the second touch signal lines TL21 to TL2$p$ may be connected to some others of the touch electrode pads TP of the touch pad area TDA. That is to say, the second touch signal lines TL21 to TL2$p$ may connect the first touch electrodes TE disposed on the second side of the touch sensor area TSA with some others of the touch electrode pads TP of the touch pad area TDA. For example, as shown in FIG. 5, a (2-1) touch signal line TL21 may be electrically connected to the first touch electrodes TE disposed in the first column of the touch sensor area TSA, and a (2-2) touch signal line TL22 may be electrically connected to the first touch electrodes TE disposed in the second column of the touch sensor area TSA. In addition, a (2-(p-1)) touch signal line TL2($p$-1) may be electrically connected to the first touch electrodes TE disposed in the (p-1)$^{th}$ column of the touch sensor area TSA, and a (2-p) touch signal line TL2$p$ may be electrically connected to the first touch electrodes TE disposed in the p$^{th}$ column of the touch sensor area TSA.

The second touch signal lines TL21 to TL2$p$ may be connected to the first touch electrodes TE disposed on the second side of the touch sensor area TSA, passing around the first side and the fourth side (e.g., a left side shown in FIG. 5) of the touch sensor area TSA.

One end of each of the third touch signal lines RL1 to RLq may be connected to the respective one of the second touch electrodes RE disposed on a third side of the touch sensor area TSA. The third side (e.g., a right side shown in FIG. 5) of the touch sensor area TSA may refer to the right longer side of the touch sensor area TSA that is located between the first side and the second side of the touch sensor area TSA. The other end of each of the third touch signal lines RL1 to RLq may be connected to some others of the touch electrode pads TP of the touch pad area TDA. That is to say, the third touch signal lines RL1 to RLq may connect the second touch electrodes RE disposed on the third side of the touch sensor area TSA with some others of the touch electrode pads TP of the touch pad area TDA.

For example, as shown in FIG. 5, a first-third (3-1) touch signal line RL1 may be electrically connected to the second touch electrodes RE disposed in the first row of the touch sensor area TSA, a second-third (3-2) touch signal line RL2 may be electrically connected to the second touch electrodes RE disposed in the second row of the touch sensor area TSA, and a third-third (3-3) touch signal line RL3 may be electrically connected to the second touch electrodes RE disposed in the third row of the touch sensor area TSA. In addition, a (q-2)$^{th}$-third (3-(q-2)) touch signal line RLq-2 may be electrically connected to the second touch electrodes RE disposed in the (q-2)$^{th}$ row of the touch sensor area TSA, a (q-1)$^{th}$-third (3-(q-1)) touch signal line RLq-1 may be electrically connected to the second touch electrodes RE disposed in the (q-1)$^{th}$ row of the touch sensor area TSA, and a q$^{th}$-third (3-q) touch signal line RLq may be electrically connected to the second touch electrodes RE disposed in the CO row of the touch sensor area TSA.

The touch electrode pads TP may be disposed on one side of the second substrate SUB2 (shown in FIG. 3). The touch circuit board 410 may be attached on the touch electrode pads TP using an anisotropic conductive film. Accordingly, the touch electrode pads TP may be electrically connected to the touch circuit board 410.

The first touch electrodes TE and the second touch electrodes RE may be driven by mutual capacitive sensing or self capacitive sensing.

Initially, when the first touch electrodes TE and the second touch electrodes RE are driven by the mutual capacitive sensing, the touch driving signals are supplied to the first touch electrodes TE through the first touch signal lines TL11 to TL1$p$ and the second touch signal lines TL21 to TL2$p$, to charge the mutual capacitances formed at the intersections of the first touch electrodes TE and the second touch electrodes RE. Then, a change in the amount of charges of the mutual capacitances is measured by the second touch electrodes RE, and it is determined whether there is a touch input based on the change in the amount of charges of the mutual capacitance. The touch driving signals may have touch driving pulses.

Secondly, when the first touch electrodes TE and the second touch electrodes RE are driven by the self capacitive sensing, the touch driving signals are supplied to both the first touch electrodes TE and the second touch electrodes RE through the first touch signal lines TL11 to TL1$p$, the second touch signal lines TL21 to TL2$p$ and the third touch signal lines RL1 to RLq, to charge the self capacitances of the driving electrodes TE and the sensing electrodes RE. Then, a change in the amount of the charges of the self-capacitances are measured through the first touch signal lines TL11 to TL1$p$, the second signal lines TL21 to TL2$p$ and the third touch signal lines RL1 to RLq, and it is determined whether a touch input is made based on the changes in the amount of the charges of the self-capacitances.

In the following description, the touch electrodes are driven by the mutual capacitive sensing, in which a plurality of touch driving pulses is applied to the first touch electrodes TE, and a change in the amount of charges of the mutual capacitances is measured through the third touch signal lines RL1 to RLq connected to the second touch electrodes RE. In the mutual capacitive sensing, the first touch electrodes TE may serve as touch driving electrodes, the second touch electrodes RE may serve as touch sensing electrodes, the first touch signal lines TL11 to TL1$p$ and the second touch signal lines TL21 to TL2$p$ may serve as touch driving lines, and the third touch signal lines RL1 to RLq may serve as touch sensing lines.

In addition, a first guard line GL1, a second guard line GL2, a third guard line GL3, a fourth guard line GL4, a first ground line GRL1 and a second ground line GRL2 may be disposed in the touch peripheral area TPA.

The first guard line GL1 may be disposed on the outer side of the outermost one RLq of the third touch signal lines RL1 to RLq. In addition, the first ground line GRL1 may be disposed on the outer side of the first guard line GL1. That is to say, the first guard line GL1 is disposed between the outermost one RLq of the third touch sing lines RL1 to RLq and the first ground line GRL1, so that it can reduce the influence by a change in the voltage of the first ground line GRL1 on the (3-q) touch signal line RLq. One end of the first guard line GL1 and one end of the first ground line GRL1 may be connected to the touch electrode pads that are the rightmost ones.

The second guard line GL2 may be disposed between the innermost one RL1 of the third touch signal lines RL1 to RL1 and the (1-p) touch signal line TL1p. Accordingly, it is possible to suppress the (3-1) touch signal line RL1 and the (1-p) touch signal line TL1p from affecting each other. One end of the second guard line GL2 may be connected to the touch electrode pads.

The third guard line GL3 may be disposed between the (1-1) touch signal line TL11 and the (2-1) touch signal line TL21 that is the innermost one of the second touch signal lines TL21 to TL2p. Accordingly, the third guard line GL3 can suppress the (1-1) touch signal line TL11 and the (2-1) touch signal line TL21 from affecting each other. One end of the third guard line GL3 may be connected to the touch electrode pads.

The fourth guard line GL4 may be disposed on the outer side of the outermost one TL2p of the second touch signal lines TL21 to TL2p. In addition, the second ground line GRL2 may be disposed on the outer side of the fourth guard line GL4. That is to say, the fourth guard line GL4 is disposed between the outermost one TL2p of the second touch sing lines TL21 to TL2p and the second ground line GRL2, so that it can reduce the influence by a change in the voltage of the second ground line GRL2 on the (2-p) touch signal line TL2p. One end of the fourth guard line GL4 and one end of the second ground line GRL2 may be connected to the touch electrode pads that are the leftmost ones.

The first ground line GRL1 is disposed on the right outermost side (i.e., the third side) of the touch sensing unit 500, and the second ground line GRL2 is disposed on the lower, left and upper outermost sides (i.e., the first, second and the fourth sides) of the touch sensing unit 500. A ground voltage is applied to the first ground line GRL1 and the second ground line GRL2. Therefore, when static electricity is applied from the outside, the static electricity may be discharged to the first ground line GRL1 and the second ground line GRL2.

When the first touch electrodes TE and the second touch electrodes RE are driven by a mutual capacitive sensing, it is desired that a ground voltage is applied to the first guard line GL1, the second guard line GL2, the third guard line GL3 and the fourth guard line GL4.

Additionally, touch dummy pads TDP1 and TDP2 may be further disposed on the outer sides of the array of the touch pads TP in the first direction (X direction). That is to say, a first touch dummy pad TDP1 may be disposed on one side (left side) of the array of touch pads TP in the first direction (X direction), and a second touch dummy pad TDP2 may be disposed on the other side (right side) of the array in the first direction (Y direction).

In addition, a first touch alignment mark TAM1 may be disposed on one side (left side) of the first touch dummy pad TDP1 in the first direction (X direction), and a second touch alignment mark TAM2 may be disposed on the other side (right side) of the second touch dummy pad TDP2 in the first direction X.

Figure 6:
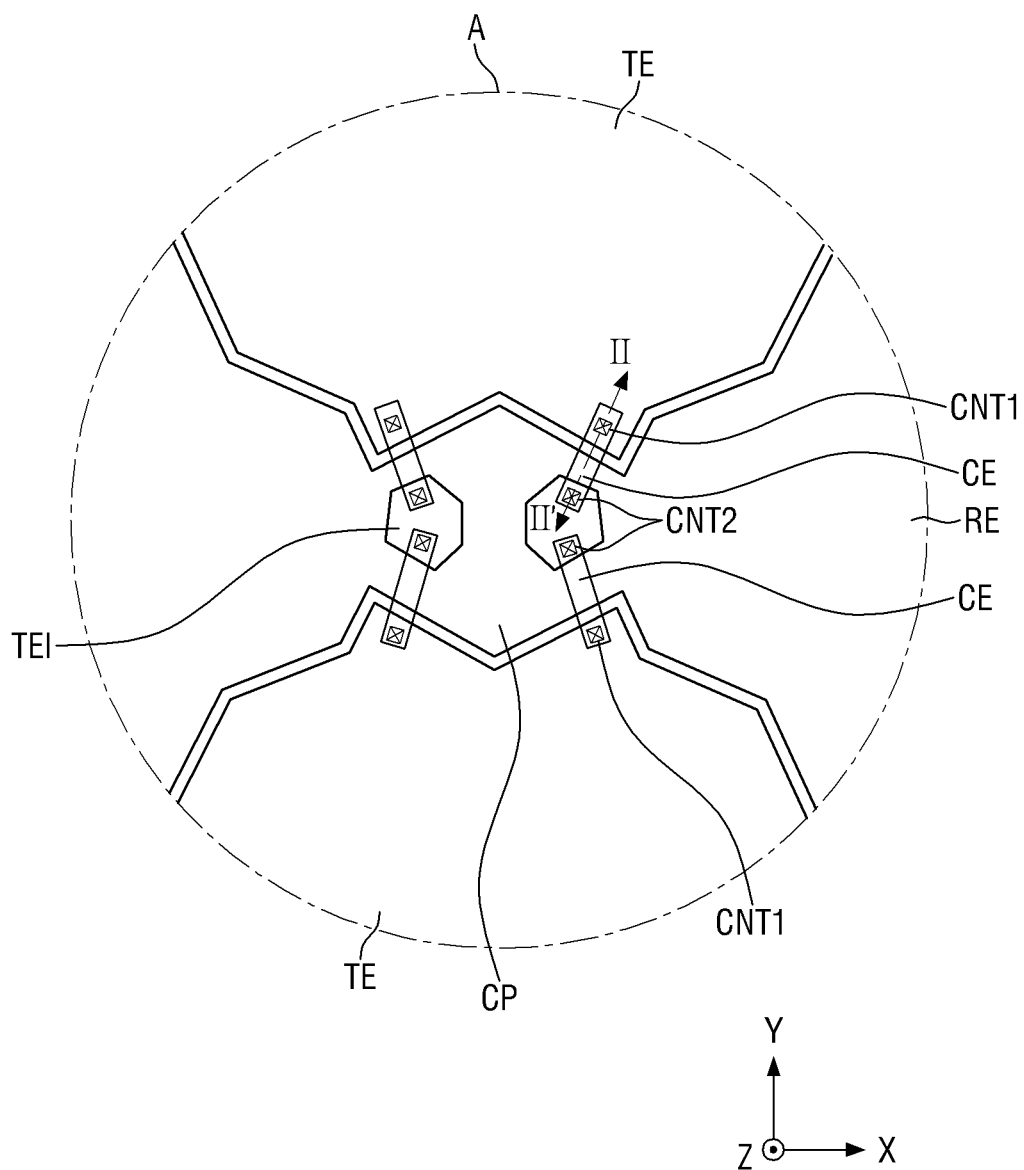
FIG. 6 is an enlarged plan view of an exemplary embodiment of area A of FIG. 5.
Figure 7:
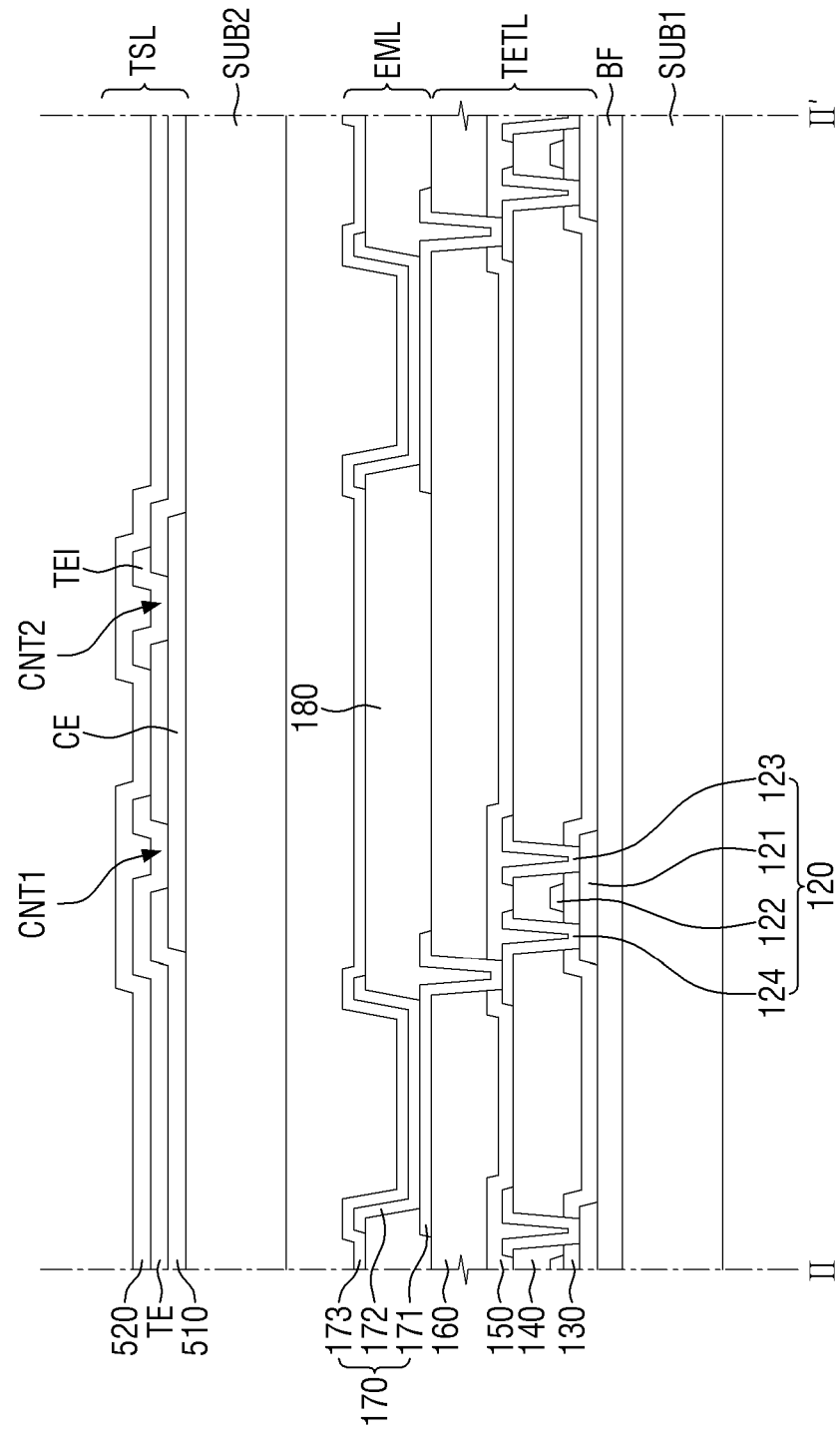
FIG. 7 is a cross-sectional view taken along line II-II' of FIG. 6.

FIG. 6 is an enlarged plan view of an exemplary embodiment of area A of FIG. 5. FIG. 7 is a cross-sectional view taken along line II-II' of FIG. 6.

First, referring to FIG. 7, the thin-film transistor layer TFTL is formed on the first substrate SUB1. The thin-film transistor layer TFTL includes thin-film transistors 120, a gate insulating layer 130, an interlayer dielectric layer 140, a protective layer 150, and a planarization layer 160.

The buffer film BF may be formed on a surface of the first substrate SUB1. The buffer film BF may be formed on the surface of the substrate SUB in order to protect the thin-film transistors 120 and an organic emitting layer 172 of the emission material layer EML from moisture that is likely to permeate through the first substrate SUB1. The buffer film BF may be formed of a plurality of inorganic layers stacked on one another alternately. For example, the buffer film BF may be made up of multiple layers in which one or more inorganic layers of a silicon nitride layer, a silicon oxynitride layer, a silicon oxide layer, a titanium oxide layer and an aluminum oxide layer are alternately stacked on one another. The buffer film BF may be eliminated.

The thin-film transistors 120 are disposed on the buffer film BF. Each of the thin-film transistor 120 includes an activate layer 121, a gate electrode 122, a source electrode 123, and a drain electrode 124. In FIG. 7, the thin-film transistors 120 are implemented as top-gate transistors in which the gate electrode 122 is located above the active layer 121. It is, however, to be understood that the exemplary embodiments is not limited thereto. That is to say, the thin-film transistors 210 may be implemented as bottom-gate transistors in which the gate electrode 122 is located below the active layer 121, or as double-gate transistors in which the gate electrodes 122 are disposed above and below the active layer 121.

The active layer 121 is formed on the buffer film. The active layer 121 may be an organic semiconductor such as polycrystalline silicon, single crystal silicon, low-temperature polycrystalline silicon and amorphous silicon, or an oxide semiconductor. A light-blocking layer for blocking external light incident on the active layer 121 may be formed between the buffer film and the active layer 121.

The gate insulating layer 130 may be formed on the active layer 121. The gate insulating layer 130 may be formed of an inorganic layer, for example, a silicon nitride layer, a silicon oxynitride layer, a silicon oxide layer, a titanium oxide layer, or an aluminum oxide layer.

The gate electrodes 122 and gate lines may be formed on the gate insulating layer 130. The gate electrodes 122 and the gate lines may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The interlayer dielectric layer 140 may be formed over the gate electrodes 122 and the gate lines. The interlayer dielectric layer 140 may be formed of an inorganic layer, for example, a silicon nitride layer, a silicon oxynitride layer, a silicon oxide layer, a titanium oxide layer, or an aluminum oxide layer.

The source electrodes 123 and the drain electrodes 124 may be formed on the interlayer dielectric layer 140. Each of the source electrodes 123 and the drain electrodes 124 may be connected to the active layer 121 through a contact hole penetrating through the gate insulating layer 130 and the interlayer dielectric layer 140. The source electrode 123 and the drain electrode may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The protective layer 150 may be formed on the source electrode 213 and the drain electrode 124 in order to insulate the thin-film transistors 120. The protective layer 150 may be formed of an inorganic layer, for example, a silicon nitride layer, a silicon oxynitride layer, a silicon oxide layer, a titanium oxide layer, or an aluminum oxide layer.

The planarization layer 160 may be formed on the protective layer 150 to provide a flat surface over the step differences of the thin-film transistors 120. The planarization layer 160 may be formed of an organic layer such as an acryl resin, an epoxy resin, a phenolic resin, a polyamide resin and a polyimide resin.

The emission material layer EML is formed on the thin-film transistor layer TFTL. The emission material layer EML includes light-emitting elements 170 and a bank layer 180.

The light-emitting elements 170 and the bank layer 180 are formed on the planarization layer 160. Each of the light-emitting elements 170 may include a first electrode 171, an organic emitting layer 172, and a second electrode 173.

The first electrode 171 may be formed on the planarization layer 160. The first electrode 171 is connected to the source electrode 123 of the thin-film transistor 120 through the contact hole penetrating through the protective layer 150 and the planarization layer 160.

In the top-emission organic light-emitting diode that light exits from the organic emitting layer 172 toward the second electrode 173, the first electrode 171 may be made of a metal material having a high reflectivity such as a stacked structure of aluminum and titanium (Ti/Al/Ti), a stacked structure of aluminum and ITO (ITO/Al/ITO), an APC alloy and a stacked structure of APC alloy and ITO (ITO/APC/ITO). The APC alloy is an alloy of silver (Ag), palladium (Pd) and copper (Cu).

In the bottom-emission organic light-emitting diode where light exits from the organic emitting layer 172 toward the first electrode 173, the first electrode 171 may be formed of a transparent conductive material (TCP) such as ITO and IZO that can transmit light, or a semi-transmissive conductive material such as magnesium (Mg), silver (Ag) and an alloy of magnesium (Mg) and silver (Ag). In such case, when the first electrode 171 is made of a semi-transmissive metal material, the light extraction efficiency can be increased by using microcavities.

The bank layer 180 may be formed to separate the first electrode 171 from another first electrode on the planarization layer 250 in order to define the pixels P. The bank layer 180 may be formed to cover the edge of the first electrode 171. The bank layer 180 may be formed of an organic layer such as an acryl resin, an epoxy resin, a phenolic resin, a polyamide resin and a polyimide resin.

In each of the pixels P, the first electrode 171, the organic emitting layer 172 and the second electrode 173 so that holes from the first electrode 171 and electrons from the second electrode 173 are combined with each other in the organic emitting layer 172 to emit light.

The organic emitting layer 172 is formed on the first electrode 171 and the bank layer 180. The organic emitting layer 172 may include an organic material and emit light of a certain color. For example, the organic emitting layer 172 may include a hole transporting layer, an organic material layer, and an electron transporting layer. In such case, the organic emitting layer 172 of a red pixel may emit red light, the organic emitting layer 172 of a green pixel may emit green light, and the organic emitting layer 172 of a blue pixel may emit blue light. Alternatively, the organic light-emitting layers 172 of the pixels P may emit white light, in which case the red pixel may further include a red color filter layer, the green pixel may further include a green color filter layer, and the blue pixel may further include a blue color filter layer.

The second electrode 173 is formed on the organic emitting layer 172. The second electrode 173 may be formed to cover the organic emitting layer 172. The second electrode 173 may be a common layer formed across the pixels P. A capping layer may be formed on the second electrode 173.

In the top-emission organic light-emitting diode, the second electrode 173 may be formed of a transparent conductive material (TCP) such as ITO and IZO that can transmit light, or a semi-transmissive conductive material such as magnesium (Mg), silver (Ag) and an alloy of magnesium (Mg) and silver (Ag). When the second electrode 173 is formed of a semi-transmissive metal material, the light extraction efficiency can be increased by using microcavities.

In the bottom-emission organic light-emitting diode, the second electrode 173 may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and copper (Cu).

The second substrate SUB2 is disposed on the emission material layer EML, and the touch sensor layer TSL is formed on the second substrate SUB2. The touch sensor layer TSL may include the first touch electrodes TE, the second touch electrodes RE, the connection electrodes CE, the first touch signal lines TL11 to TL1p, the second touch signal lines TL21 to TL2p, the third touch signal lines RL1 to RLq, the guard lines GL1, GL2, GL3 and GL4, and the ground lines GRL1 and GRL2 as shown in FIG. 5. For convenience of illustration, FIGS. 6 and 7 shows only the first touch electrodes TE, the second touch electrodes RE, first touch island electrodes TEI and the connection electrode CE disposed between the first touch electrodes TE of the touch sensor layer TSL.

The connection electrodes CE are formed on the second substrate SUB2. Each of the connection electrodes CE connects one of the touch electrodes TE with the respective ones of the first touch island electrodes TEL One end of each of the connection electrodes CE may be connected to one of the first touch electrodes TE, and the other end thereof may be connected to the respective one of the first touch island electrodes TEI.

Referring to FIGS. 6 and 7, the connection electrodes CE may be formed as an opaque metal conductive layer. For example, the connection electrodes CE may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. Accordingly, the connection electrodes CE may not overlap with the pixels P as shown in FIG. 7 in order not to lower the aperture ratio of the pixels P, and may be disposed to overlap with the bank layer 180.

A first insulating layer 510 is formed on the connection electrodes CE. The first insulating layer 510 may be formed of an inorganic layer, for example, a silicon nitride layer, a silicon oxynitride layer, a silicon oxide layer, a titanium oxide layer, or an aluminum oxide layer.

The first touch electrodes TE, first touch island electrodes TEI and second touch electrodes RE are formed on the first insulating layer 510. The first touch electrode TE may be connected to the connection electrode CE through a first contact hole CNT1 that penetrates the first insulating layer 510 to expose the connection electrode CE. The first touch island electrode TEI may be connected to the connection electrode CE through a second contact hole CNT2 that penetrates the first insulating layer 510 to expose the connection electrode CE. In this manner, the first touch electrode TE may be connected to the first touch island electrode TEI through the connection electrode CE. Accordingly, the first touch electrodes TE arranged in the second direction (Y-axis direction) may be electrically connected with one another in each of the columns.

The first touch electrodes TE, the first touch island electrodes TEI and the second touch electrodes RE may be made of a transparent metal oxide (TCO) such as ITO and IZO, which can transmit light. Therefore, even though the first touch electrodes TE, the first touch island electrodes TEI and the second touch electrodes RE overlap with the pixels P, the aperture ratio of the pixels P is not reduced.

A second insulating layer 520 is formed on the first touch electrodes TE, the first touch island electrodes TEI and the second touch electrodes RE. The second insulating layer 520 may be formed of an inorganic layer, for example, a silicon nitride layer, a silicon oxynitride layer, a silicon oxide layer, a titanium oxide layer, or an aluminum oxide layer.

Figure 8:
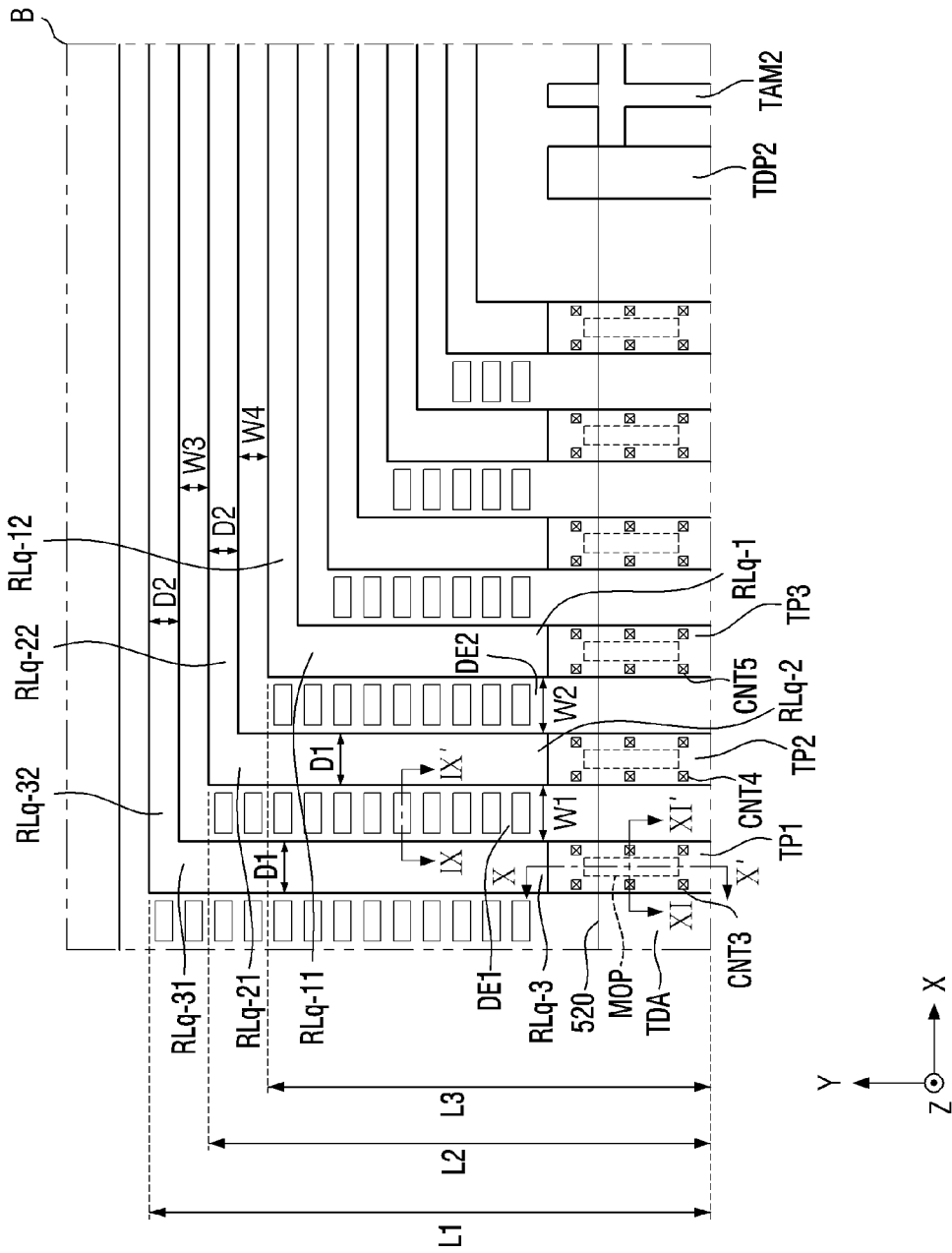
FIG. 8 is an enlarged plan view of a first exemplary embodiment of area B of FIG. 5.
Figure 9:
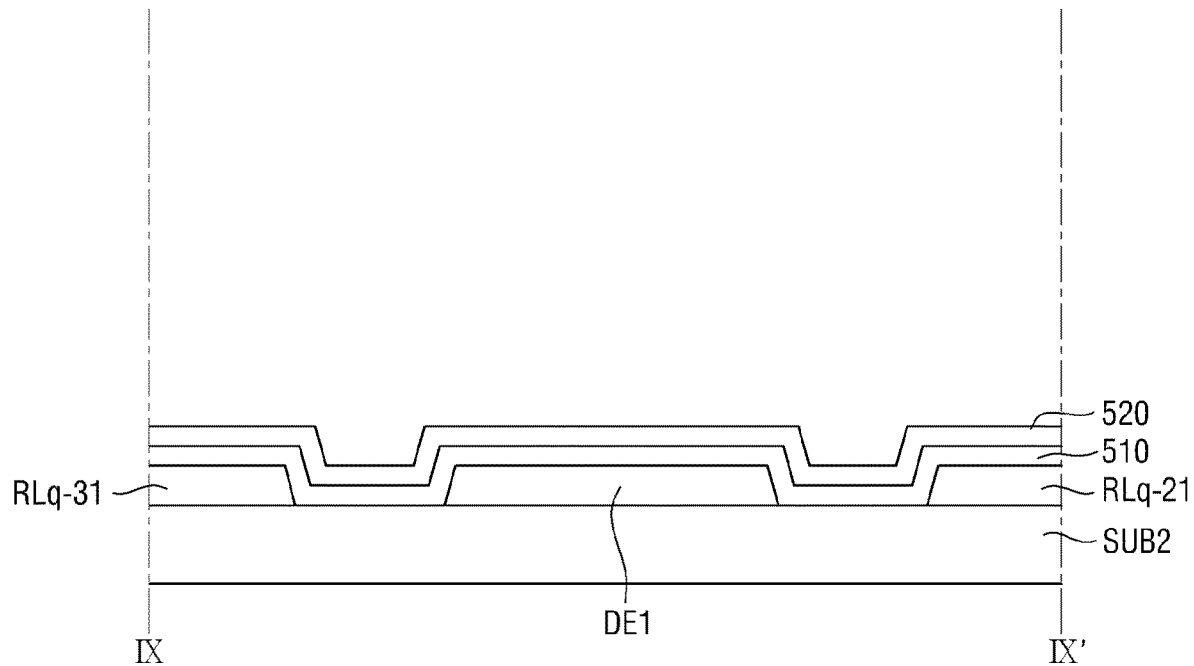
FIG. 9 is a cross-sectional view taken along line IX-IX' of FIG. 8.
Figure 10:
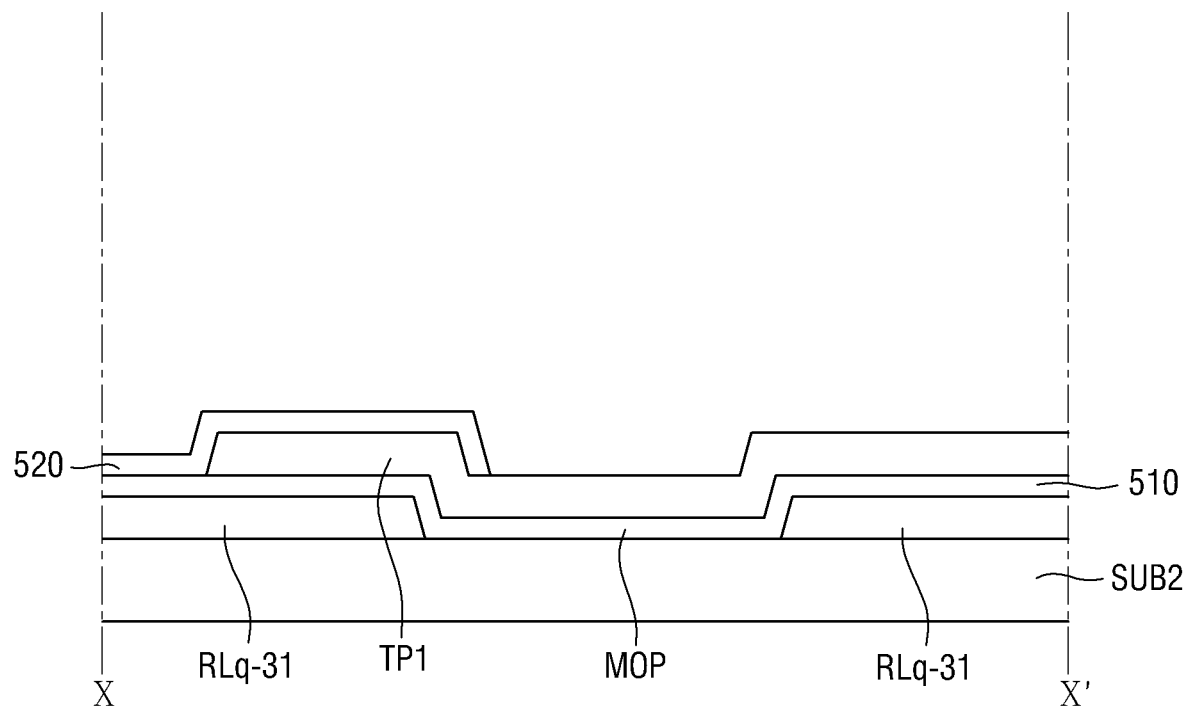
FIG. 10 is a cross-sectional view taken along line X-X' of FIG. 8.
Figure 11:
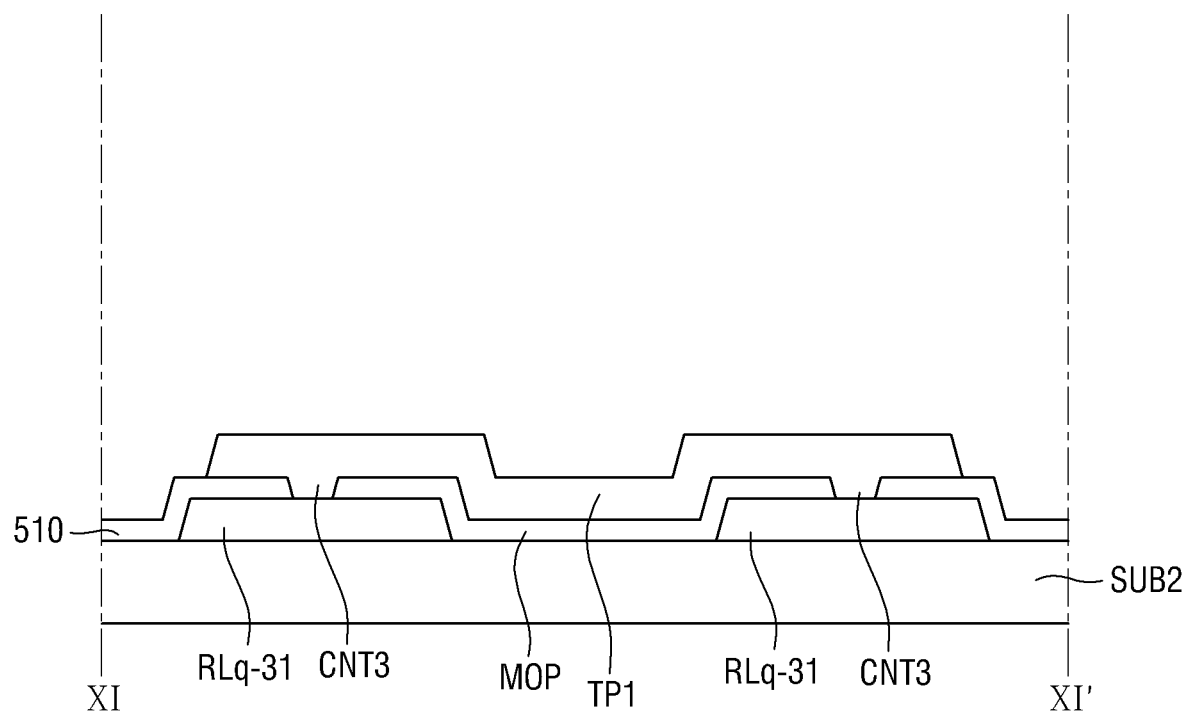
FIG. 11 is a cross-sectional view taken along line XI-XI' of FIG. 8.

FIG. 8 is an enlarged plan view of a first exemplary embodiment of area B of FIG. 5. FIG. 9 is a cross-sectional view taken along line IX-IX' of FIG. 8. FIG. 10 is a cross-sectional view taken along line X-X' of FIG. 8. FIG. 11 is a cross-sectional view taken along line XI-XI' of FIG. 8. FIG. 8 shows a (3-(q-1)) touch signal line RLq-1, a (3-(q-2)) touch signal line RLq-2 and a (3-(q-3)) touch signal line RLq-3 among the third touch signal lines RL1 to RLq, for example. In the following description, the (3-(q-1)) touch signal line RLq-1 will be referred to as a first signal line, the (3-(q-2)) touch signal line RLq-2 will be referred to as a second signal line, and the (3-(q-3)) touch signal line RLq-3 will be referred to as a third signal line, for convenience of illustration.

Referring to FIGS. 8 to 11, the first signal line (or the (3-(q-1)) touch signal line RLq-1) may include line portions, such as a first line part RLq-11 and a second line part RLq-12, the second signal line (or the (3-(q-2)) touch signal line RLq-2) may include line portions, such as a first line part RLq-21 and a second line part RLq-22, and the third signal line (or the (3-(q-3)) touch signal line RLq-3) may include line portions, such as a first line part RLq-31 and a second line part RLq-32.

In addition, the touch pads TP of the touch pad area TDA may include first to third touch pads TP1 to TP3.

The first line parts RLq-11, RLq-21 and RLq-31 of the first to third signal lines, respectively, may overlap with and electrically connected to the touch pads TP1 to TP3, respectively. Specifically, the first line part RLq-11 of the first signal line RLq-1 may overlap with and electrically connected to the third touch pad TP3, the first line part RLq-21 of the second signal line RLq-2 may overlap with and electrically connected to the second touch pad TP2, and the first line part RLq-31 of the third signal line RLq-3 may overlap with and electrically connected to the first touch pad TP1. The first line parts RLq-11, RLq-21 and RLq-31 may be extended in the second direction (Y direction).

The lengths L1, L2, and L3 of the first line parts RLq-11, RLq-21 and RLq-31 in the second direction (Y direction) may increase toward one side of the first direction (X direction). For example, the length L1 of the first line part RLq-31 of the third signal line RLq-3 may be larger than the lengths L2 and L3 of the first line part RLq-21 of the second signal line RLq-2 and the first line part RLq-11 of the first signal line RLq-1, and the length L2 of the first line part RLq-21 of the second signal line RLq-2 may be larger than the length L1 of the first line part RLq-11 of the first signal line RLq-1.

The second line parts RLq-12, RLq-22 and RLq-32 of the first to third signal lines, respectively, may be connected to the first line parts RLq-11, RLq-21 and RLq-31, respectively, and may be extended in the first direction (X direction) intersecting the second direction (Y direction) in which the first line parts RLq-11, RLq-21 and RLq-31 are extended.

That is to say, the second line part RLq-12 of the first signal line RLq-1 may be connected to the first line part RLq-11 of the first signal line RLq-1, the second line part RLq-22 of the second signal line RLq-2 may be connected to the first line part RLq-21 of the second signal line RLq-2, and the second line part RLq-32 of the third signal line RLq-3 may be connected to the first line part RLq-31 of the third signal line RLq-3.

The first line parts RLq-11, RLq-21 and RLq-31 of the first to third signal lines RLq-1, RLq-2, and RLq-3 may be extended to the touch pad area TDA. Each of the first line parts RLq-11, RLq-21 and RLq-31 may have a metal opening MOP in the touch pad area TDA that is recessed. The metal opening MOP may be formed through each of the first line parts RLq-11, RLq-21 and RLq-31 in the thickness direction (z direction) from the surface thereof. As described above, the first line parts RLq-11, RLq-21 and RLq-31 are made of an opaque conductive material. In this regard, as each of the first line parts RLq-11, RLq-21 and RLq-31 includes the metal opening MOP recessed in the touch pad area TDA, during the process of curing the sealing member SEAL overlapping with the touch pad area TDA, a laser used for the curing process can be transferred more efficiently to the sealing member SEAL through the through the metal opening MOP.

The metal opening MOP may be surrounded by the material of the first line parts RLq-11, RLq-21 and RLq-31.

As described above, the touch pads TP1 to TP3 may be disposed on the first line parts RLq-11, RLq-21 and RLq-31 of the touch pad area TDA. Referring to FIGS. 8 and 10, the touch pads TP1 to TP3 may overlap the metal openings MOP of the first line parts RLq-11, RLq-21 and RLq-31, respectively. The touch pads TP1 to TP3 may include the same material as the material of the touch electrodes TE and RE. That is to say, the touch pads TP1 to TP3 may be made of a material including a transparent conductive material.

In an exemplary embodiment illustrated in FIGS. 8 and 10, the metal openings MOP in the first line parts RLq_31 of the third signal line RLq-3 may be disposed on the second substrate SUB2. The first insulating layer 510 may be disposed on the first line parts RLq_31 spaced apart from one another due to the metal openings MOP. The first insulating layer 510 may be disposed on the whole surface of the second substrate SUB2. The first touch pad TP1 may be disposed on the first insulating layer 510. The portion of the first touch pad TP1 in the metal opening MOP may have the lowest surface level because the first line part RLq-31 is not disposed therein.

The second insulating layer 520 may be disposed on the first touch pad TP1. The second insulating layer 520 may expose a portion of the first touch pad TP1 that is bonded to the lead lines of the touch circuit board 410 (shown in FIG. 2) and may cover the rest of the first touch pad TP1.

Referring to FIGS. 8 and 11, the first insulating layer 510 may include a plurality of third contact holes CNT3 electrically connecting the first line part RLq-31 of the third signal line RLq-3 with the first touch pad TP1. The plurality of third contact holes CNT3 may surround the metal opening MOP when viewed from the top. Although six third contact holes CNT3 are shown in FIG. 8, the number of third contact holes CNT3 is not limited to six. The first insulating layer 510 may further include a plurality of fourth contact holes CNT4 electrically connecting the first line part RLq-21 of the second signal line RLq-2 with the second touch pad TP2, and a plurality of fifth contact holes CNT5 electrically connecting the first line part RLq-11 of the first signal line RLq-1 with the third touch pad TP3.

Referring back to FIG. 8, the width D1 of the first line parts RLq-31, RLq-21 and RLq-11 in the first direction (X direction) may be larger than the width D2 of the second line parts RLq-32, RLq-22 and RLq-12 in the second direction (Y direction). By reducing the widths of the second line parts RLq-32, RLq-22 and RLq-12 more than the widths of the first line parts RLq-31, RLq-21 and RLq-11, it is possible to reduce the area of the touch peripheral area TPA on the lower side of the touch sensor area TSA in the second direction (Y direction), i.e., the dead space.

In addition, the spacing widths W1 and W2 between adjacent ones of the first line parts RLq-31, RLq-21 and RLq-11 in the first direction (X direction) may be larger than the spacing widths W3 and W4 between adjacent ones of the second line parts RLq-32, RLq-22 and RLq-12 in the second direction (Y direction).

Since the spacing widths W3 and W4 between the adjacent ones of the second line parts RLq-32, RLq-22 and RLq-12 in second direction (Y direction) are smaller, the line density of the area where the second line parts RLq-32, RLq-22 and RLq-12 are disposed may be larger than the line density of the area where the first line parts RLq-31, RLq-21 and RLq-11 are disposed. If there is a difference between the line densities, a defect may occur in that the lines are visible from outside the display. In other words, if there is a difference in the line densities, reflected light may scatter differently at the steps (edges) between the lines, such that the lines may be observed from the outside.

In order to improve such issues, in the touch sensing unit 500 according to the illustrated exemplary embodiment, dummy electrodes DE1 and DE2 may be located adjacent to the first line parts having a lower line density than to the second line parts having a higher density. For example, the dummy electrodes DE1 and DE2 may be disposed between the first line parts having a lower line density to compensate for difference in the density.

The first dummy electrode DE1 may be disposed between the adjacent first line part RLq-31 of the third signal line RLq-3 and the first line part RLq-21 of the second signal line RLq-2, and the second dummy electrode DE2 may be disposed between the adjacent first line part RLq-21 of the second signal line RLq-2 and the first line part RLq-11 of the first signal line RLq-1.

The dummy electrodes DE1 and DE2 may include the same material as the first signal line and the third signal line. The dummy electrodes DE1 and DE2 may be disposed on the same layer as the first line part RLq-31 of the third signal line RLq-3 and the first line part RLq-21 of the second signal line RLq-2 and may be made of the same material.

As shown in FIG. 8, more than one first dummy electrodes DE1 and more than one second dummy electrodes DE2 may be arranged such that they are spaced apart from one another in the second direction (Y direction). That is to say, an array of dummy electrodes arranged in the second direction (Y direction) may be disposed between adjacent ones of the first line parts. The arrays of the dummy electrodes may be arranged in the first direction (X direction).

The numbers of dummy electrodes that the arrays have may increase or decrease in the first direction (X direction). For example, the number of dummy electrodes of the array of the first dummy electrodes DE1 may be greater than the number of dummy electrodes of the array of the second dummy electrodes DE2.

Referring to FIGS. 8 and 9, the first dummy electrode DE1 may be disposed between the adjacent first line part RLq-31 of the third signal line RLq-3 and the first line part RLq-21 of the second signal line RLq-2. The first dummy electrode DE1 may be disposed on the same layer as the first line part RLq-31 of the third signal line RLq-3 and the first line part RLq-21 of the second signal line RLq-2. The first insulating layer 510 may be disposed on the first line part RLq-31, the first line part RLq-21, and the first dummy electrode DE1. The second insulating layer 520 may be disposed on the first insulating layer 510. The first dummy electrode DE1 may be disposed directly on the upper surface of the second substrate SUB2.

Referring back to FIG. 8, each dummy electrode in the array of the first dummy electrodes DE1 may be aligned with the adjacent one of the second line parts in the first direction (X direction), and, similarly, each dummy electrode in the array of the second dummy electrodes DE2 may be aligned with the adjacent one of the second line parts in the first direction (X direction). In other words, the dummy electrodes DE1 and DE2 aligned in the first direction (X direction) are located in the region in which the first line parts are disposed that having lower line density than the region in which the second line parts are disposed, it is possible to increase the line density in the region where the first line parts are disposed.

By arranging the dummy electrodes in this manner, it is possible to suppress the reflected light from scattering differently at the steps (edges) between the lines due to the difference in line density, and, as a result, it is possible to minimize or prevent the defect that the lines are visible from the outside Hereinafter, other exemplary embodiments will be described. In the following description, the same or similar elements will be denoted by the same or similar reference numerals, and redundant descriptions will be omitted or briefly described.

Figure 12:
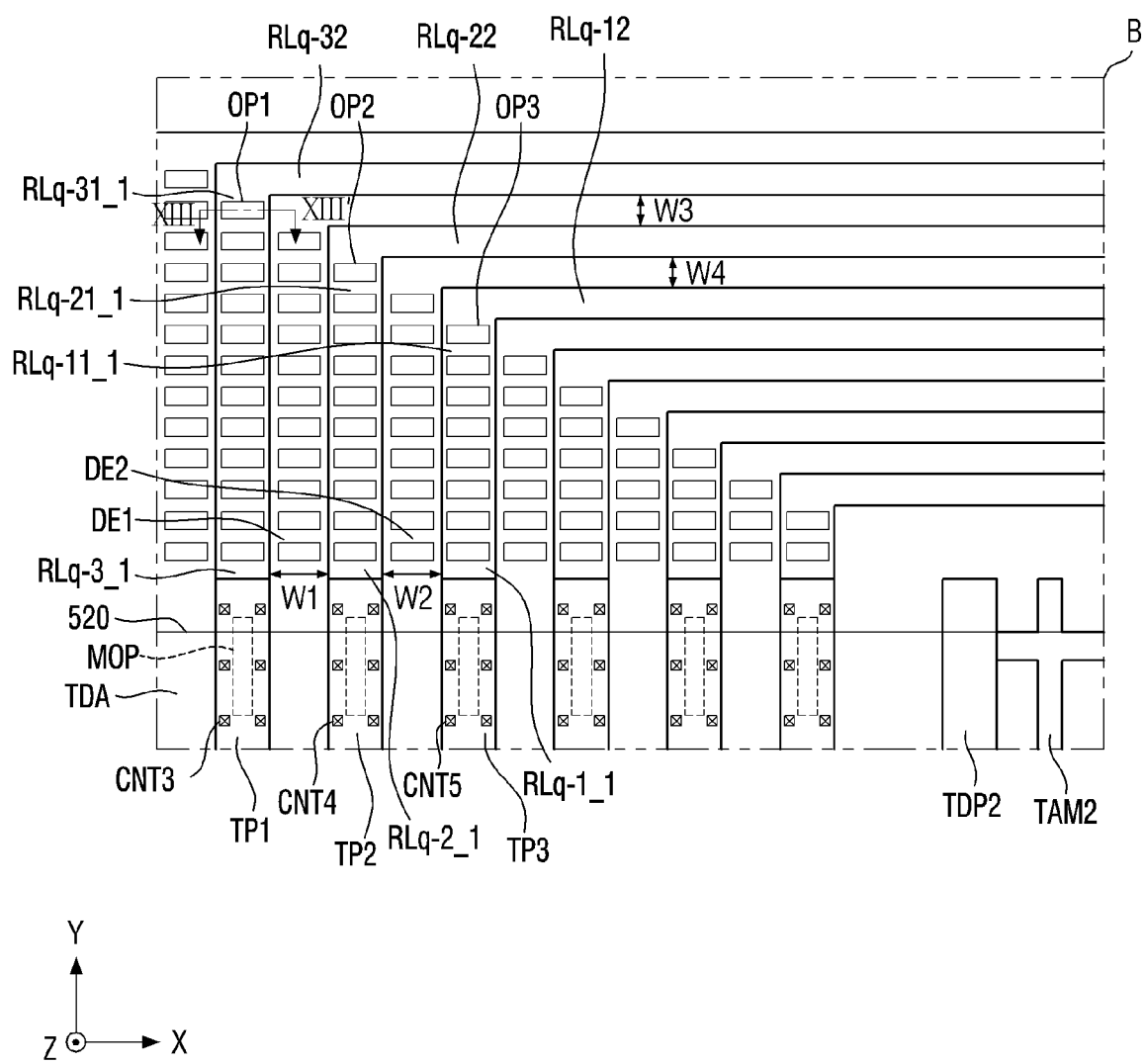
FIG. 12 is an enlarged plan view of a second exemplary embodiment of area B of FIG. 5
Figure 13:
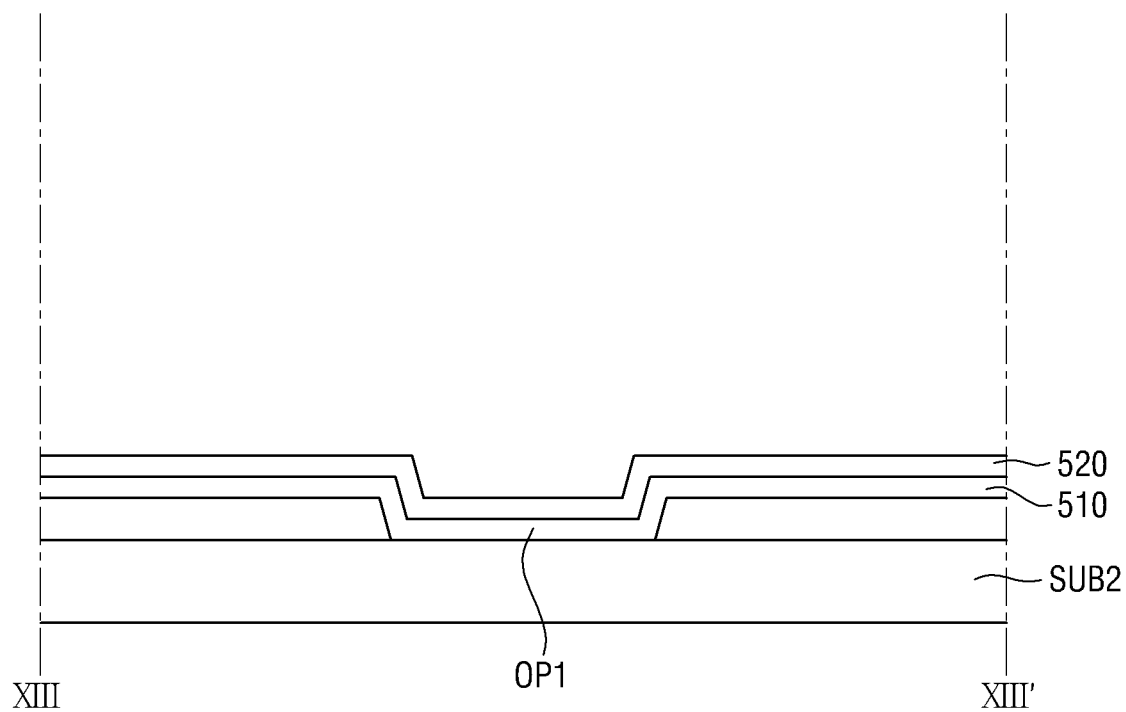
FIG. 13 is a cross-sectional view taken along line XIII-XIII' of FIG. 12.

FIG. 12 is an enlarged plan view of a second exemplary embodiment of area B of FIG. 5. FIG. 13 is a cross-sectional view taken along line XIII-XIII' of FIG. 12.

A touch sensing unit according to the exemplary embodiment shown in FIGS. 12 and 13 is different from the touch sensing unit according to the above-described exemplary embodiment in that the former includes first line parts RLq-11_1 to RLq-31_1.

Specifically, the first line parts RLq-11_1 to RLq-31_1 of the first to third signal lines RLq-1_1, RLq-2_1, and RLq-3_1 may further include opening OP1 to OP3 penetrating the first line parts RLq-11_1 to RLq-31_1 from the surfaces thereof, respectively.

That is to say, the first openings OP1 may penetrate the first line part RLq-31_1 of the third signal line RLq-3_1 in the thickness direction from the surface of the first line part RLq-31_1, the second openings OP2 may penetrate the first line part RLq-21_1 of the second signal line RLq-2_1 in the thickness direction from the surface of the first line part RLq-21_1, and the third openings OP3 may penetrate the first line part RLq-11_1 of the first signal line RLq-1_1 in the thickness direction from the surface of the first line part RLq-11_1.

The openings OP1 to OP3 may be aligned with the adjacent second line parts in the first direction (X direction), respectively.

As shown in FIG. 12, there may be more than one first openings OP1 and more than one openings OP3, and they may be spaced apart from one another along the second direction (Y direction). That is to say, the openings are arranged in the second direction (Y direction) inside each of the first line parts RLq-11_1, RLq-21_1 and RLq-31_1, and the arrays of the openings may be arranged in the first direction (X direction).

The numbers of the openings of the arrays may increase or decrease in the first direction (X direction). For example, the number of the first openings OP1 of the array may be greater than the number of the second openings OP2 of the array and the number of the third openings OP3 of the array, and the number of the second openings OP2 of the array may be greater than the number of the third openings OP3 of the array.

Referring to FIG. 13, the first line part RLq-31_1 of the third signal line RLq-3_1 may be disposed on the second substrate SUB2, and the first opening OP1 may formed through the first line part RLq-31_1. A through-hole is formed in the first line part RLq-31_1 by the first opening OP1, such that the upper surface of the second substrate SUB2 may be exposed via the first opening OP1. The first insulating layer 510 may be disposed on the first line part RLq-31_1, and the first opening OP1 may be filled with the first insulating layer 510. The second insulating layer 520 may be disposed on the first insulating layer 510.

Figure 14:
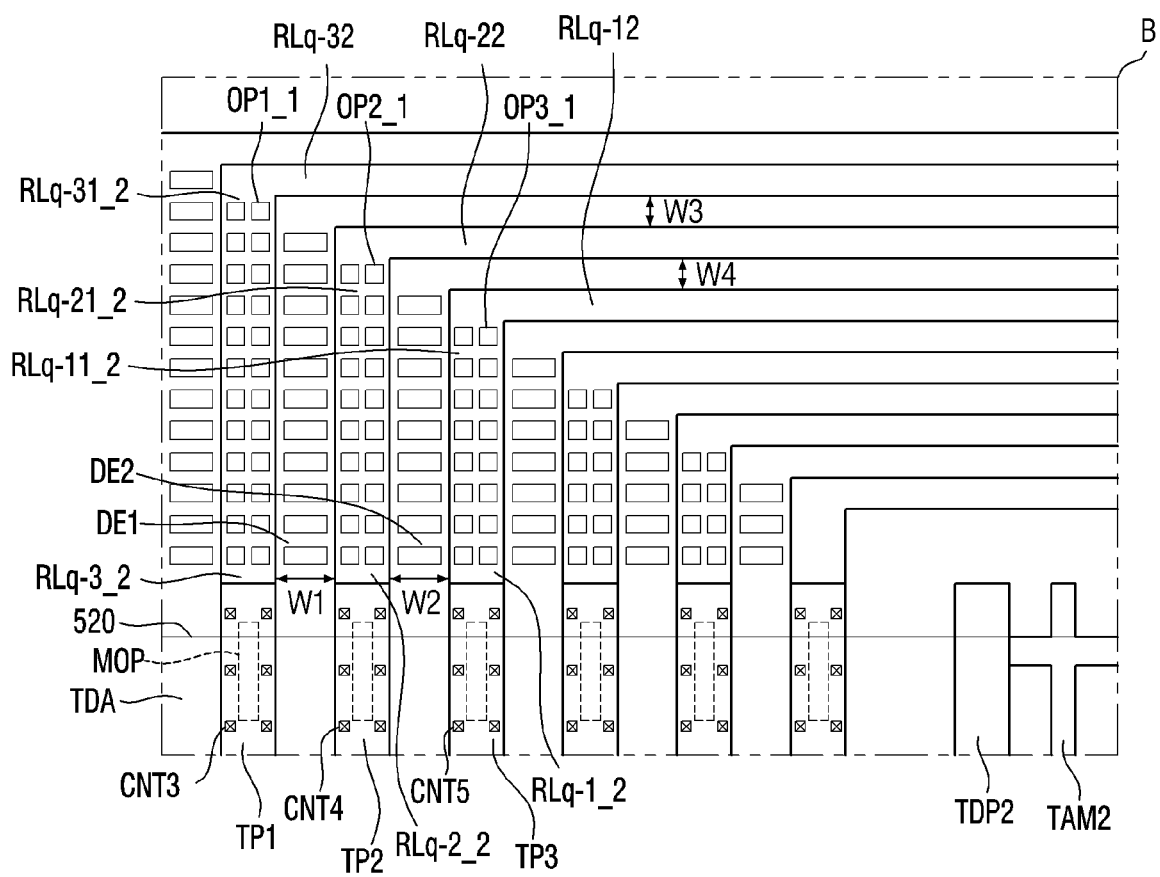
FIG. 14 is an enlarged plan view of a third exemplary embodiment of area B of FIG. 5.

FIG. 14 is an enlarged plan view of a third exemplary embodiment of area B of FIG. 5.

The exemplary embodiment shown in FIG. 14 is different from the exemplary embodiment of FIG. 12 in that the openings OP1_1 to OP3_1 according to the exemplary embodiment of FIG. 12 are separated from each other in the first direction (X direction).

Specifically, each of the openings OP1__1 to OP3_1 may include two patterns separated from each other in the first direction (X direction).

The other elements are identical to those described above with reference to FIGS. 12 and 13; and, therefore, the redundant description will be omitted.

Figure 15:
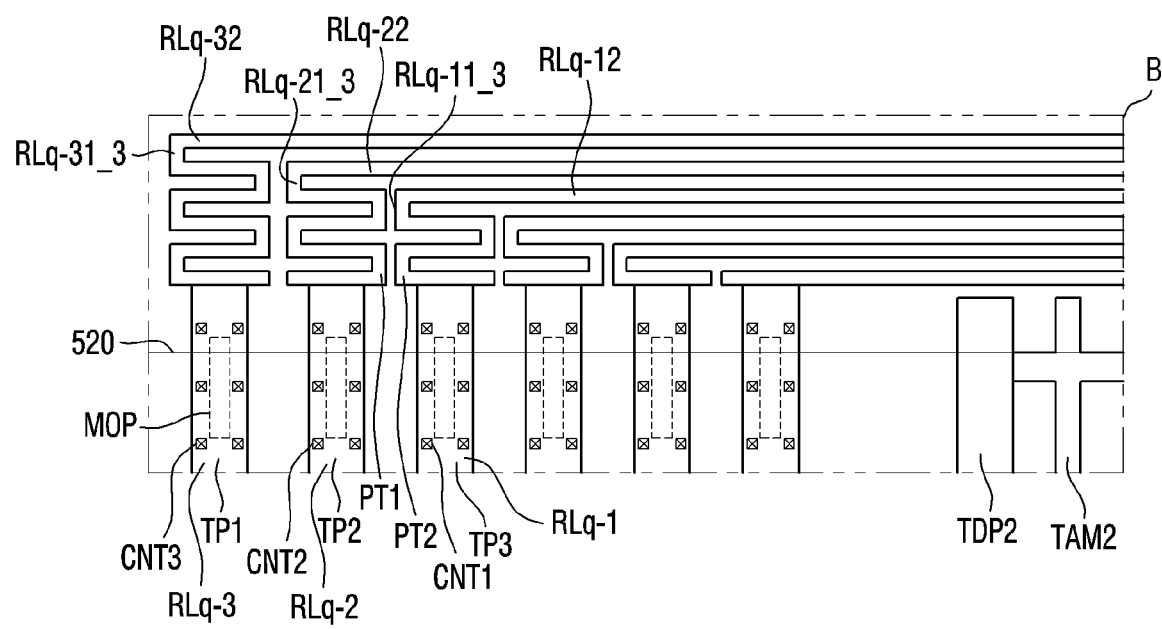
FIG. 15 is an enlarged plan view of a fourth exemplary embodiment of area B of FIG. 5.

FIG. 15 is an enlarged plan view of a fourth exemplary embodiment of area B of FIG. 5.

A touch sensing unit according to the exemplary embodiment shown in FIG. 15 is different from the touch sensing unit according to the above-described exemplary embodiment in that each of first line parts RLq-11_3 to RLq-31_3 includes at least one bent portion.

Specifically, each of the first line parts RLq-11_3 to RLq-31_3 of the first to third signal lines may have a serpentine shape. As used herein, the serpentine shape may refer to a shape that is extended in the first direction (X direction), bent to be extended in the second direction (Y direction), and bent again to be extended in the first direction (X direction). That is to say, it may refer to a shape that is bent at least twice, once in the first direction (X direction) and once in the second direction (Y direction).

The numbers of bending points of the first line parts of the touch sensing unit according to the exemplary embodiment may increase in one direction.

For example, the first line part RLq-11_3 of the first signal line RLq-1 may have five bending points, i.e., may be bent five times. The first line part RLq-21_3 of the second signal line RLq-2 may have seven bending points, i.e., may be bent seven times. The first line part RLq-31_3 of the third signal line RLq-3 may have nine bending points, i.e., may be bent nine times.

In addition, the lengths of the first line parts of the touch sensing unit may increase along one direction. Specifically, the length of the first line part RLq-31_3 of the third signal line RLq-3 may be larger than the length of the first line part RLq-21_3 of the second signal line RLq-2 and the length of the first line part RLq-11_1 of the first signal line RLq-1, and the length of the first line part RLq-21_3 of the second signal line RLq-2 may be larger than the length of the first line part RLq-11_3 of the first signal line RLq-1. In addition, the first signal line parts RLq-11_3 to RLq-31_3 may include the protruding patterns PT1 and PT2 that protrude in the first direction (X direction) from the touch pads TP1 to TP3, respectively, when viewed from the top. For example, the first signal line part RLq-21_3 of the second signal line RLq-2 may include a first protrusion pattern PT1, and the first signal line part RLq-11_3 of the first signal line RLq-1 may include a second protrusion pattern PT2. The first protrusion pattern PT1 and the second protrusion pattern PT2 may face each other.

Figure 16:
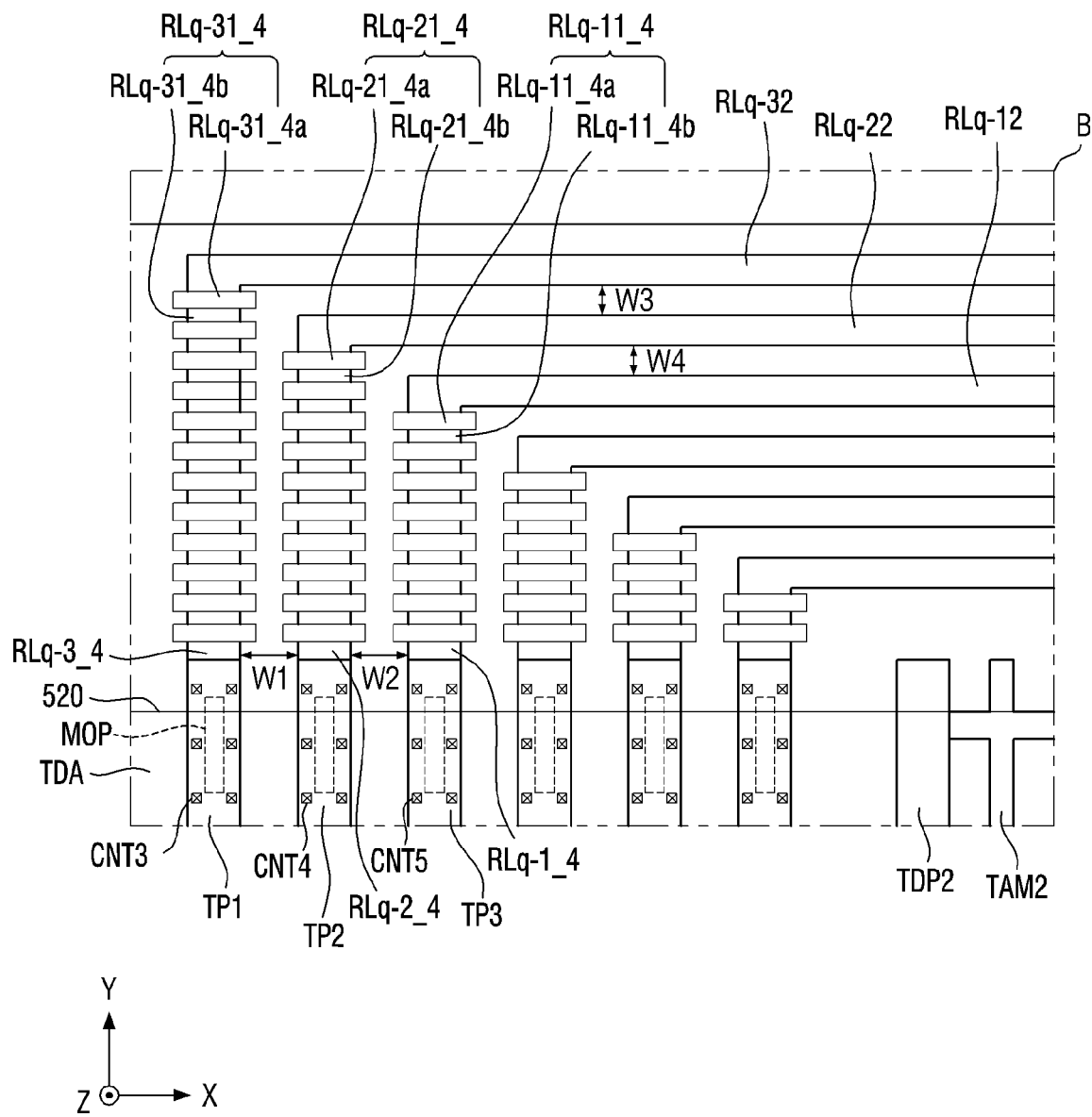
FIG. 16 is an enlarged plan view of a fifth exemplary embodiment of area B of FIG. 5e.

FIG. 16 is an enlarged plan of a fifth exemplary embodiment of area B of FIG. 5.

Referring to FIG. 16, first line parts RLq-11_4, RLq-21_4 and RLq-31_4 of the first to third signal lines may include first portions RLq-11_4a, RLq-21_4a and RLq-31_4a each having a first width, and second portions RLq-11_4b, RLq-21_4b and RLq-31_4b each having a second width smaller than the first width. The first portions RLq-11_4a, RLq-21_4a and RLq-31_4a and the second portions RLq-11_4b, RLq-21_4b and RLq-31_4b may be arranged alternately in the second direction (Y direction), respectively. The first portions RLq-11_4a, RLq-21_4a and RLq-31_4a may be aligned with the adjacent second line parts, respectively, in the first direction (X direction). The first portions RLq-11_4a, RLq-21_4a and RLq-31_4a may protrude from both sides of the second portions RLq-11_4b, RLq-21_4b and RLq-31_4b, respectively, in the first direction (X direction). It is, however, to be understood that the exemplary embodiments are not limited thereto. The first portions RLq-11_4a, RLq-21_4a and RLq-31_4a may protrude from one of the two sides of the second portions RLq-11_4b, RLq-21_4b and RLq-31_4b, respectively, in the first direction (X direction).

Figure 17:
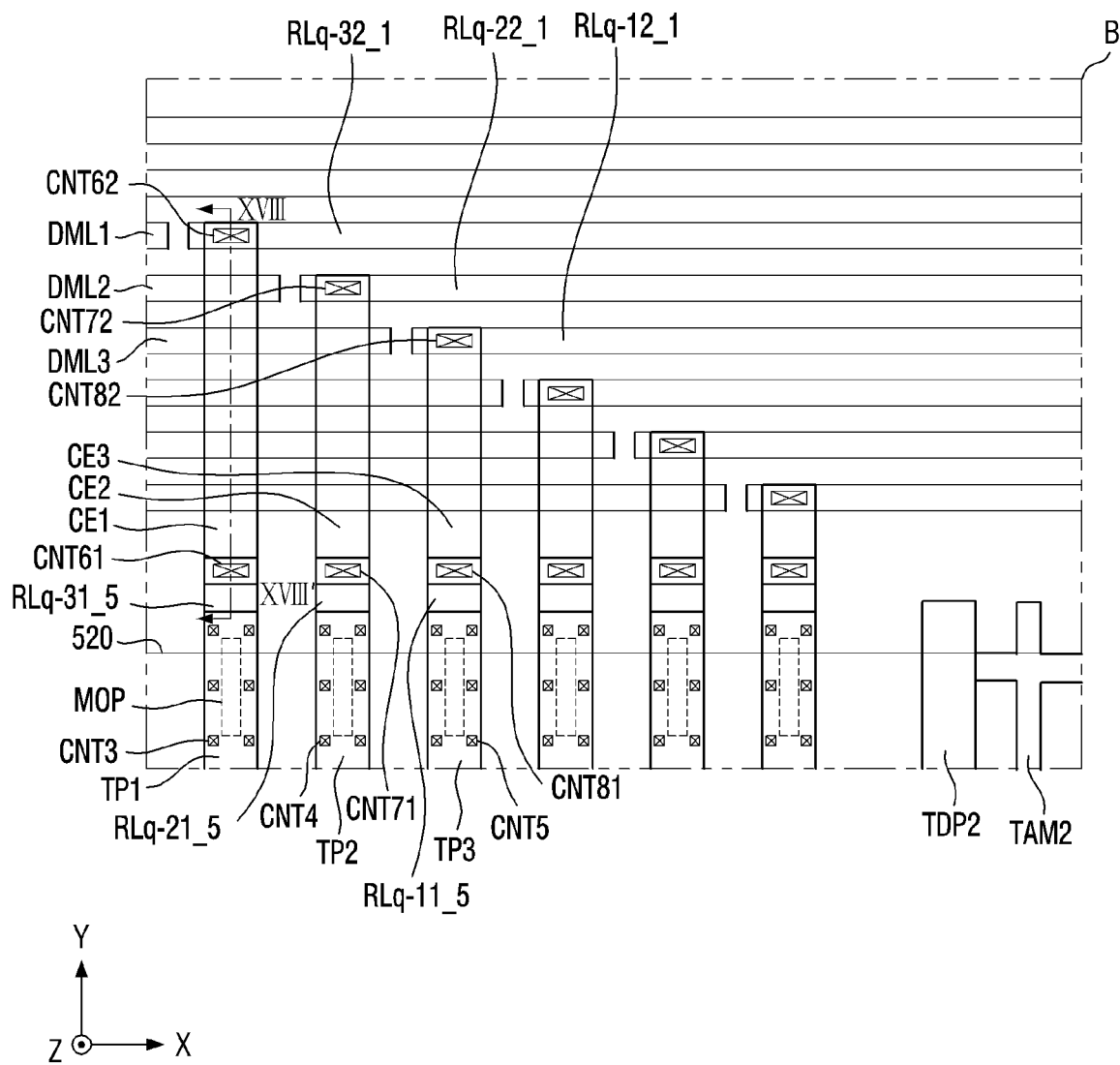
FIG. 17 is an enlarged plan view of a sixth exemplary embodiment of area B of FIG. 5.
Figure 18:
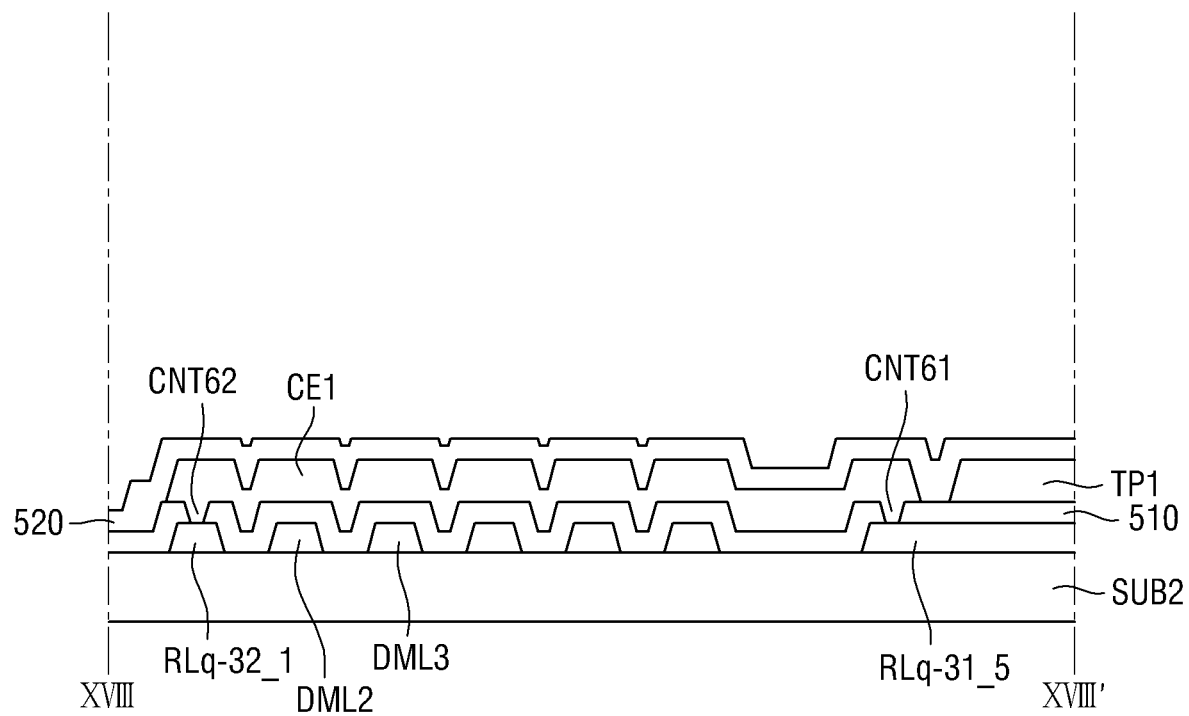
FIG. 18 is a cross-sectional view taken along line XVIII-XVIII' of FIG. 17.

FIG. 17 is an enlarged plan view of a sixth exemplary embodiment of area B of FIG. 5. FIG. 18 is a cross-sectional view taken along line XVIII-XVIII' of FIG. 17.

A touch sensing unit shown in FIGS. 17 and 18 is different from the touch sensing unit according to the above-described exemplary embodiment in that second lines parts RLq-12_1 to RLq-32_1 of the first to third signal lines are connected to first line parts RLq-11_5 to RLq-31_5 of the first to third signal lines through the connection electrodes CE1 to CE3, respectively.

More specifically, a first dummy metal line DML1 separated from the second line part RLq-32_1 of the third signal line in the first direction (X direction), a second dummy metal line DML2 separated from the second line part RLq-22_1 of the third signal line in the first direction (X direction), and a third dummy metal line DML3 separated from the second line part RLq-12_1 of the first signal line in the first direction (X direction) may be further disposed. The first connection electrode CE1 may electrically connect the first line part RLq-31_5 of the third signal line with the second line part RLq-32_1 through sixth contact holes CNT61 and CNT62, the second connection electrode CE2 may electrically connect the first line part RLq-21_5 of the third second signal line with the second line part RLq-22_1 through seventh contact holes CNT71 and CNT72, and the third connection electrode CE3 may electrically connect the first line part RLq-11_5 of the first signal line with the second line part RLq-12_1 through eighth contact holes CNT81 and CNT82.

Each of the connection electrodes CE1 to CE3 may include a transparent conductive material. For example, the connection electrodes CE1 to CE3 may include the same material as the material of the touch pads TP1 to TP3. The first connection electrode CE1 may overlap with the second and third dummy metal lines DML2 and DML3 in the thickness direction, and the second connection electrode CE2 may overlap with the third dummy metal line DML3 in the thickness direction.

Figure 19:
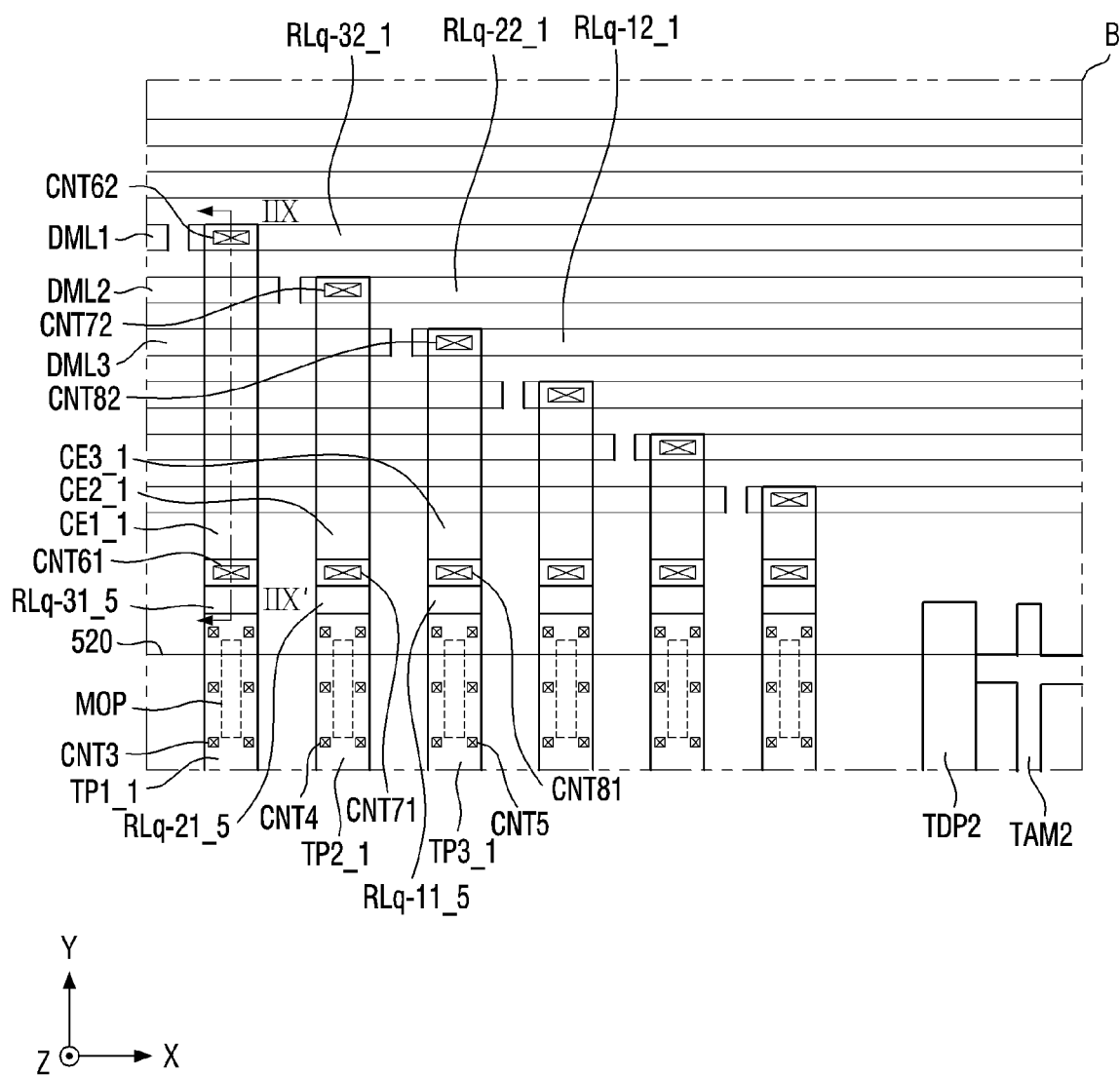
FIG. 19 is an enlarged plan view of a seventh exemplary embodiment of area B of FIG. 5.
Figure 20:
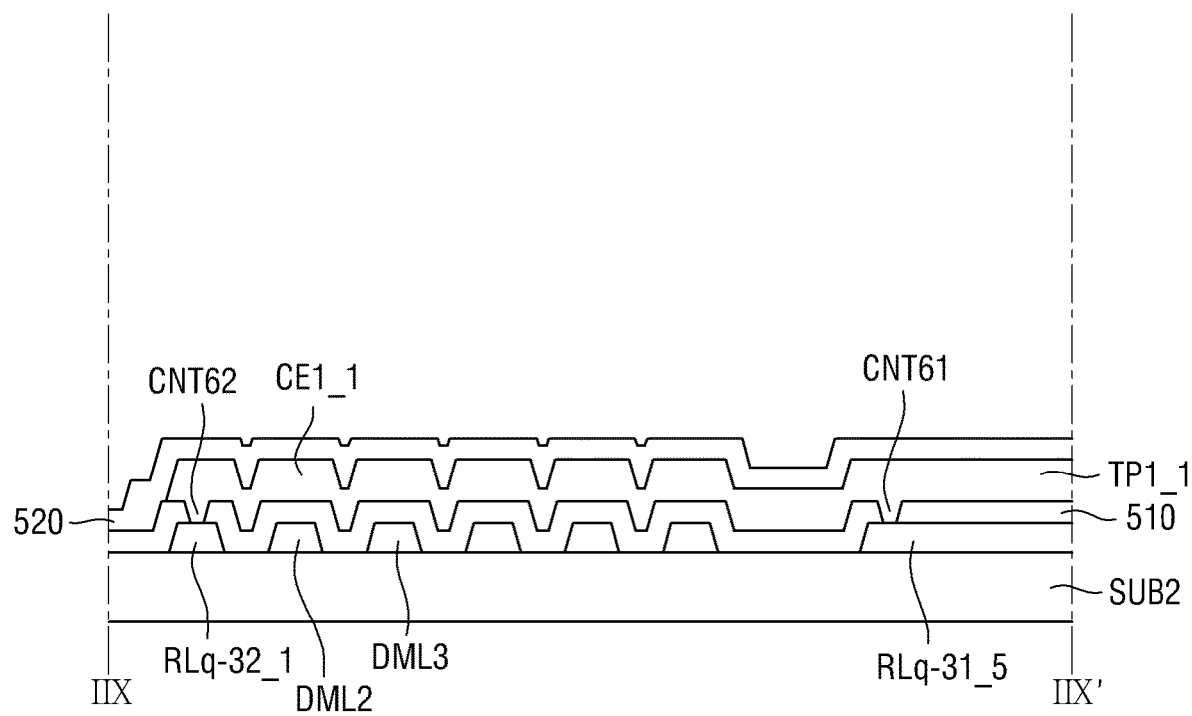
FIG. 20 is a cross-sectional view taken along line XX-XX' of FIG. 19.

The connection electrodes CE1 to CE3 may be spaced apart (separated) from one another and the touch pads TP1 to TP3 may be spaced apart (separated) from one another in the second direction (Y direction), as depicted in FIGS. 19 and 20.

FIG. 19 is an enlarged plan view of a seventh exemplary embodiment of area B of FIG. 5. FIG. 20 is a cross-sectional view taken along line XX-XX' of FIG. 19.

The exemplary embodiment shown in FIGS. 19 and 20 is different from the exemplary embodiment of FIGS. 17 and 18 in that connection electrode CE1__1 to CE3__1 are connected to touch pads TP1__1 to TP3_1, respectively.

The other elements are identical to those described above with reference to FIGS. 17 and 18; and, therefore, the redundant description will be omitted.

Figure 21:
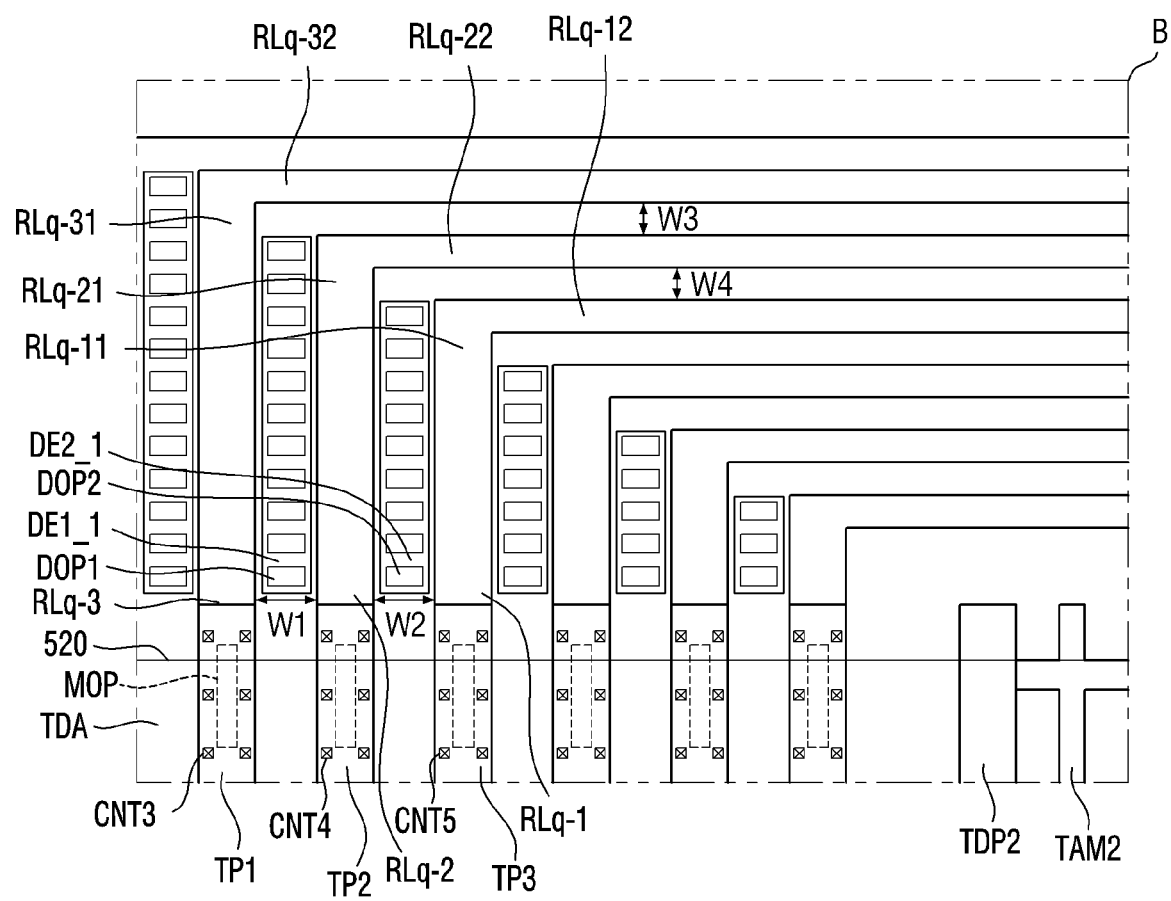
FIG. 21 is an enlarged plan view of an eighth exemplary embodiment of area B of FIG. 5.

FIG. 21 is an enlarged plan view of eighth exemplary embodiment of area B of FIG. 5.

Referring to FIG. 21, the touch sensing unit according to the exemplary embodiment may include dummy electrodes DE1_1 and DE2_1 disposed between adjacent first line parts RLq-11 to RLq-31, and the dummy electrodes DE1_1 and DE2_1 may include dummy openings DOP1 and DOP2 therein, respectively.

More than one dummy openings DOP1 and DOP2 may be formed such that they are spaced apart from one another in the second direction (Y direction). Specifically, the first dummy electrode DE1_1 and the plurality of first dummy openings DOP1 formed inside the first dummy electrode DE1_1 may be disposed between the first line part RLq-31 of the third signal line RLq-3 and the first line part RLq-21 of the second signal line RLq-2. The second dummy electrode DE2_1 and the plurality of second dummy opening DOP2 formed inside the second dummy electrode DE2_1 may be disposed between the first line part RLq-21 of the second signal line RLq-2 and the first line part RLq-11 of the first signal line RLq-1.

The number of the first dummy openings DOP1 of the array may be greater than the number of the second dummy openings DOP2 of the array.

Figure 22:
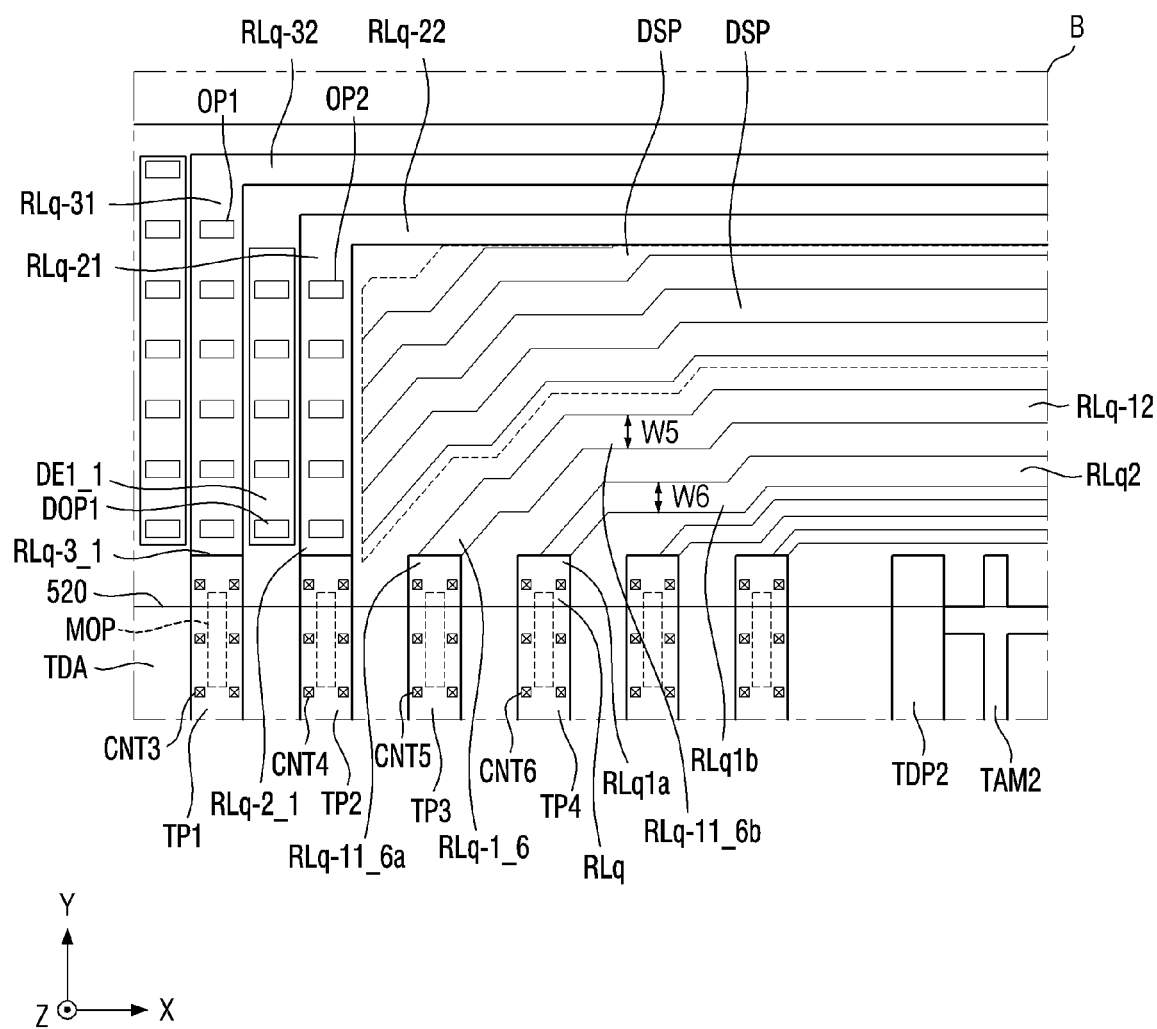
FIG. 22 is an enlarged plan view of a ninth exemplary embodiment of area B of FIG. 5.

FIG. 22 is an enlarged plan view of a ninth exemplary embodiment of area B of FIG. 5.

Referring to FIG. 22, the touch sensing unit according to the exemplary embodiment may employ first line parts RLq-11_1 to RLq-31_1 according to the exemplary embodiment of FIG. 12, and the dummy electrodes DE1_1 and DE2_1 according to the exemplary embodiment of FIG. 2.

More specifically, a (3-q) touch signal line RLq of the touch sensing unit according to the illustrated exemplary embodiment may include a first line RLq1 and a second line RLq2. In the following description, the (3-q) touch signal line RLq is defined as a fourth signal line for convenience of illustration.

The first line part RLq-11_6 of the first signal line RLq-1_6 may include a first subsidiary line part RLq-11_6a and a second subsidiary line part RLq-11_6b. The first line part RLq1 of the fourth signal line may include a first subsidiary line part RLq1a and a second subsidiary line part RLq1b. The first subsidiary line part RLq-11_6a of the first signal line RLq-1_6 and the first subsidiary line part RLq1_a of the fourth signal line RLq may overlap with and electrically connected to the third touch pad TP3 and the fourth touch pad TP4, respectively, in the thickness direction. The first subsidiary line part RLq1a may be electrically connected to the fourth touch pad TP4 through a sixth contact hole CNT6.

The shapes of the first subsidiary line part RLq-11_6a of the first signal line RLq-1_6 and the first subsidiary line part RLq1_a of the fourth signal line RLq may be substantially identical to the shapes of the touch pads TP3 and TP4, respectively, when viewed from the top. That is to say, the shape of the first subsidiary line part RLq-11_6a and the first subsidiary line part RLq1_a may have a rectangular shape including longer sides extended along the second direction (Y direction) and shorter sides extended along the first direction (X direction). The ends of the first subsidiary line part RLq-11_6a and the first subsidiary line part RLq1_a on the shorter sides may be aligned with the ends of the touch pads TP3 and TP4, respectively, overlapping with them.

The ends of the first subsidiary line part RLq-11_6a and the first subsidiary line part RLq1a on the shorter sides may be aligned with each other in the first direction (X direction). That is to say, in the display device according to this exemplary embodiment, the length of the first subsidiary line part RLq-11_6a may be equal to the length of the first subsidiary line part RLq1a in the first direction (X direction).

As shown in FIG. 22, the second subsidiary line part RLq-11_6b of the first signal line RLq-1_6 and the second subsidiary line part RLq1b of the fourth signal line RLq may have a stair-like shape and may be extended in a direction, e.g., in the first direction (X direction) from the longer side, e.g., the right longer side of the first subsidiary line parts RLq-11_6a and RLq1_a. For example, each of the second subsidiary line part RLq-11_6b and the second subsidiary line part RLq1b may be extended from the first subsidiary line part RLq-11_6a and the first subsidiary line part RLq1a toward the upper right side of the drawing, may be bent to be extended in the first direction, and may be extended again toward the upper right side.

The second substrate line part RLq-11_6b of the first signal line RLq-1_6 may be physically connected to the second line part RLq-12 of the first signal line RLq-1_6 extended along the first direction (X direction), and the second subsidiary line part RLq1b of the fourth signal line RLq may be physically connected to the second line part RLq2 of the fourth signal line RLq extended along the first direction (X direction).

The width of the second subsidiary line part RLq-11_6*b* of the first signal line RLq-1_6 may be different from the width of the second subsidiary line part RLq1*b*. For example, the width W5 of the second substrate line RLq-11_6*b* may be larger than the width W6 of the second subsidiary line part RLq1*b* of the fourth signal line RLq.

That is to say, the widths of the second subsidiary line part RLq-11_6*b* and the second subsidiary line part RLq1*b* may increase or decrease along a direction, i.e., the second direction (y direction).

Further, like the exemplary embodiment shown in FIG. 21, the touch sensing unit may include dummy electrode DE1_1 disposed between adjacent first line parts RLq-31 and RLq-21, and the dummy electrode DE1_1 may include dummy opening DOP1. In the same manner, like the exemplary embodiment shown in FIG. 12, the first line parts RLq-31 and RLq-21 may further include openings OP1 and OP2 penetrating the first line parts from the surfaces thereof, respectively.

A dummy space pattern DSP may be further disposed between a second line part RLq-22 and the first subsidiary line part RLq-11_6*a*, the first subsidiary line part RLq1*a*, the second subsidiary line part RLq-11_6*b* and the second subsidiary line part RLq1*b*, as shown in FIG. 22. The dummy space pattern DSP may have a stair-like shape and may be extended toward the opposite side in the first direction (X direction). The shape of the dummy space pattern DSP may be substantially identical to the shape of the second subsidiary wiring part RLq-11_6*b* and the second subsidiary wiring part RLq1*b* when viewed from the top.

More than one dummy space patterns DSP may be disposed as shown in FIG. 22. The plurality of dummy space patterns DSP may be spaced apart from each other in the second direction (Y direction), but the exemplary embodiments are not limited thereto. Fro example, they may be contiguous to each other. The dummy space patterns DSP may be disposed on the same layer as the signal lines and may include the same material.

Figure 23:
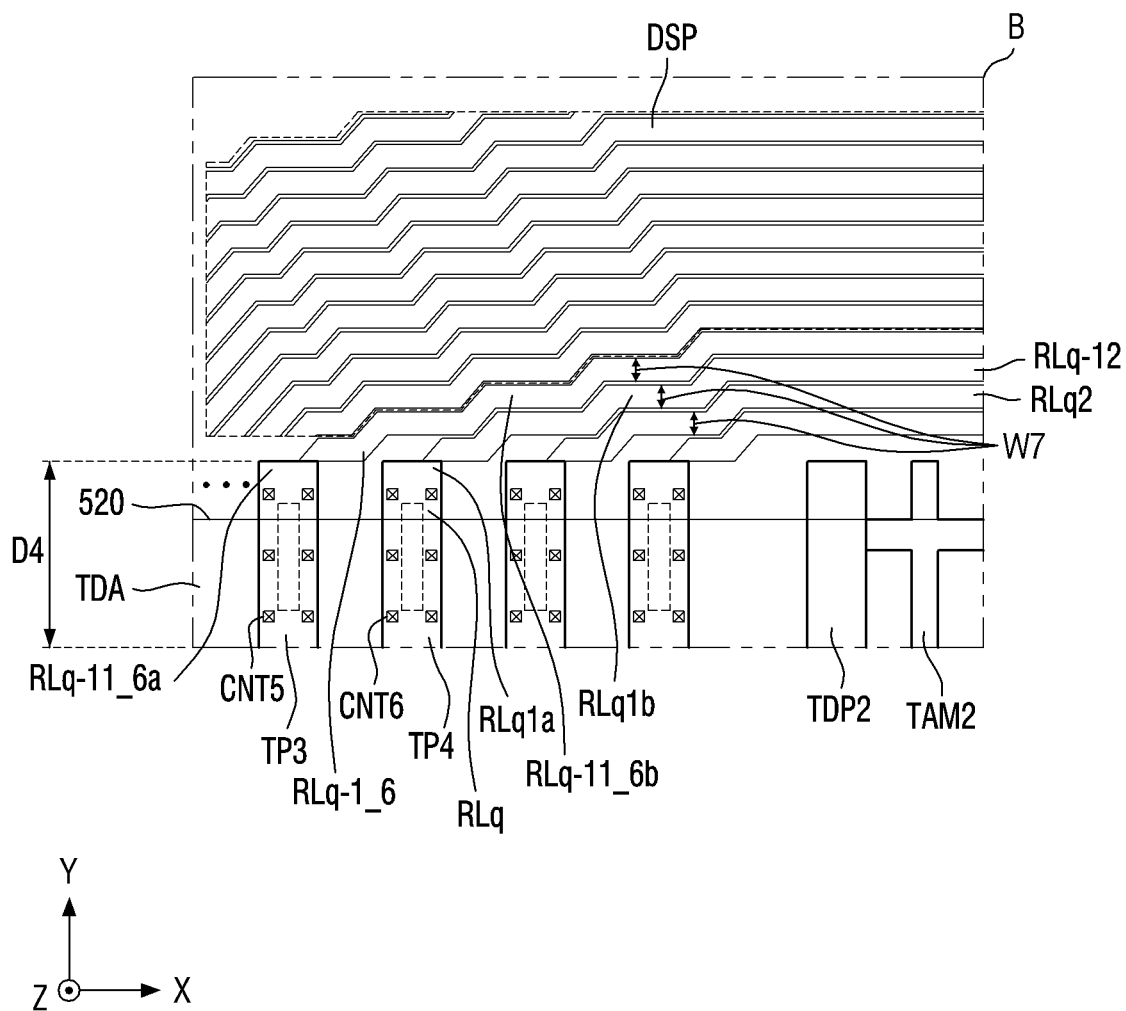
FIG. 23 is an enlarged plan view of a tenth exemplary embodiment of area B of FIG. 5.

FIG. 23 is an enlarged plan view of a tenth exemplary embodiment of area B of FIG. 5.

A touch sensing unit according to the exemplary embodiment shown in FIG. 23 is different from the touch sensing unit according to the exemplary embodiment of FIG. 22 in that a second subsidiary line part RLq-11_6*b* of the first signal line RLq-1_6 and a second subsidiary line part RLq1*b* of the fourth signal line RLq have the same width W7. Further, a length D4 of the first subsidiary line parts RLq-11_6*a* of the first touch signal line are same each other as shown in FIG. 23.

Moreover, the touch sensing unit according to the exemplary embodiment of FIG. 23 is different from the exemplary embodiment of FIG. 22 in that the touch pads TP1 and TP2, the signal lines RLq-2_1 and RLq-3_1 and the dummy electrodes DE1_1 disposed therebetween shown in FIG. 22 are eliminated.

A dummy space pattern DSP may be further disposed on the upper side of the second subsidiary line part RLq1*b* and the second line part RLq-22. The dummy space pattern DSP may have a stair-like shape and may be extended toward the opposite side in the first direction (X direction). The shape of the dummy space pattern DSP may be substantially identical to the shape of the second subsidiary line part RLq-11_6*b* and the second subsidiary line part RLq1*b* when viewed from the top.

More than one dummy space patterns DSP may be disposed as shown in FIG. 23. The plurality of dummy space patterns DSP may be spaced apart from each other in the second direction (Y direction), but the exemplary embodiments are not limited thereto. For example, they may be contiguous to each other. The dummy space patterns DSP may be disposed on the same layer as the signal lines and may include the same material.

In addition, in the touch sensing unit according to this exemplary embodiment, the width of the second subsidiary line part RLq-11_6*b* and the second subsidiary line part RLq1*b* may be equal to the width of the adjacent dummy space pattern DSP.

As shown in FIG. 23, the second subsidiary line part RLq-11_6*b* and the second subsidiary line part RLq1*b* may have a stair-like shape and may be extended in a direction, e.g., in the first direction (X direction) from the longer side, e.g., the right longer side of the first subsidiary line parts RLq-11_6*a* and RLq1*a*. For example, the second subsidiary line part RLq-11_6*b* and the second subsidiary line part RLq1*b* may be extended from the first subsidiary line part RLq-11_6*a* and the first subsidiary line part RLq1*a*, respectively, toward the right side of the drawing, may be extended from the point toward the upper right side (the direction between the first direction (X direction) and the second direction (Y direction)), and may be extended again from the point toward the right side (in the first direction (X direction)). The second substrate line part RLq-11_6*b* and the second subsidiary line part RLq1*b* may be physically connected to the second line parts RLq-12 and RLq2 extended along the first direction (X direction), respectively.

In some exemplary embodiments, the width of the space between adjacent ones of the dummy space patterns DSP may be substantially equal to the width of the space between the second subsidiary line parts RLq-11_6*b* and RLq1*b* extended generally in one direction.

For example, in some exemplary embodiments, the width of the space between adjacent ones of the dummy space patterns DSP may be substantially equal to the width of the space between the second subsidiary line parts RLq-11_6*b* and RLq1*b* extended generally in one direction.

The other elements are identical to those described above with reference to FIG. 22; and, therefore, the redundant description will be omitted.

Figure 24:
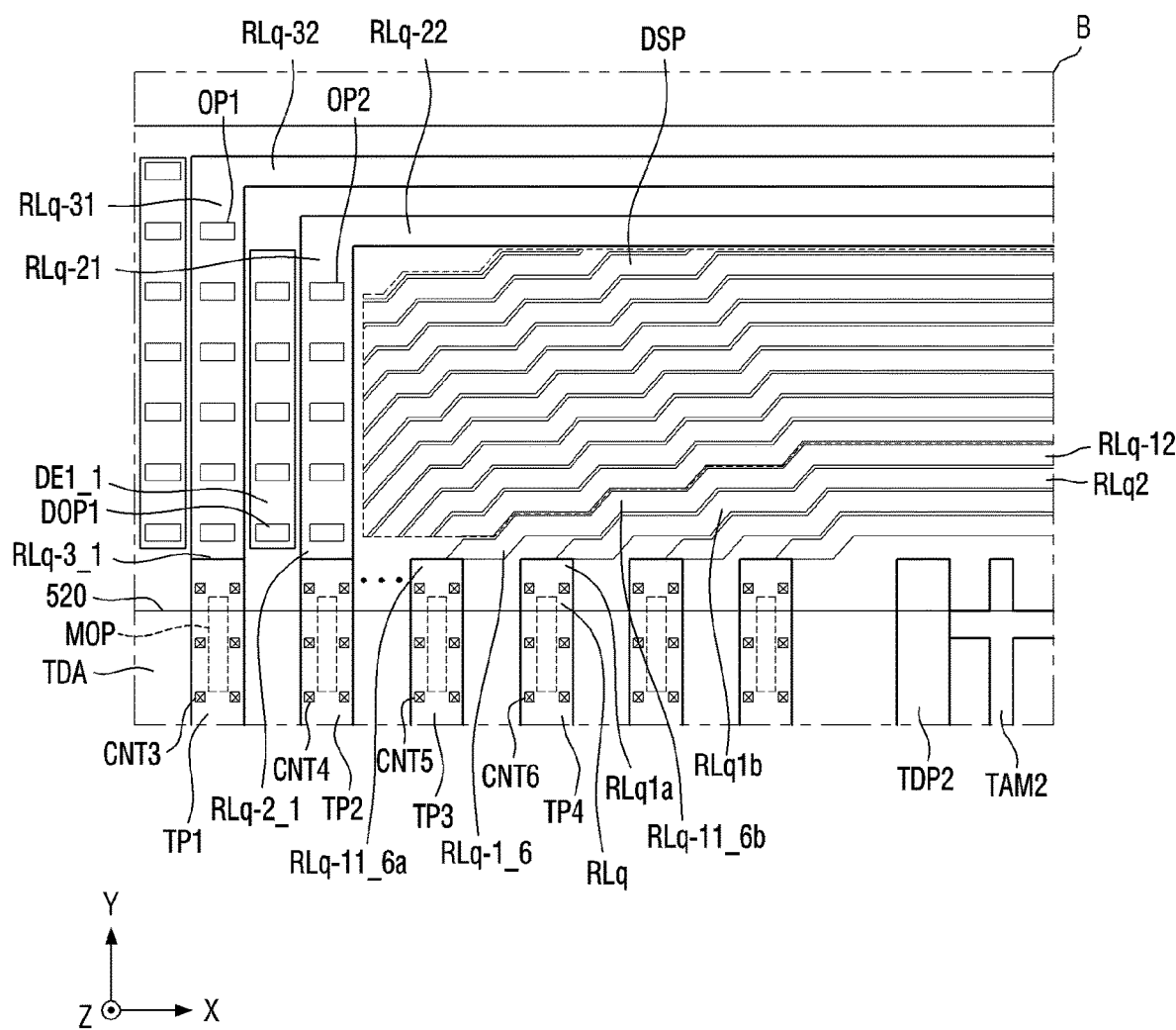
FIG. 24 is an enlarged plan view of an eleventh exemplary embodiment of area B of FIG. 5.

FIG. 24 is an enlarged plan view of an eleventh exemplary embodiment of area B of FIG. 5.

A touch sensing unit according to the exemplary embodiment shown in FIG. 24 is different from the touch sensing unit according to the exemplary embodiment of FIG. 22 in that the width of a second subsidiary line part RLq-11_6*b* is substantially equal to the width of a second subsidiary line part RLq1*b*. Moreover, the touch sensing unit according to this exemplary embodiment is different from the exemplary embodiment of FIG. 23 in that the touch pads TP1 and TP2, the signal lines RLq-2_1 and RLq-3_1 and the dummy electrodes DE1_1 disposed therebetween shown in FIG. 22 added.

The width of the second subsidiary line part RLq-11_6*b* and the second subsidiary line part RLq1*b* may be substantially equal to the width of the adjacent dummy space pattern DSP.

The other elements are identical to those described above with reference to FIG. 22; and, therefore, the redundant description will be omitted.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel having a display area and a non-display area at least partially disposed around the display area; and
a touch sensor disposed on the display panel and including a touch sensor area in the display area and a touch peripheral area in the non-display area adjacent to the touch sensor area,
wherein the touch sensor includes a plurality of touch electrodes disposed in the touch sensor area, a plurality of touch pads disposed in a touch pad area of the touch peripheral area, a plurality of touch signal lines electrically connecting the touch electrodes with the touch pads, respectively, and at least one dummy electrode disposed in the touch peripheral area between adjacent ones of the touch signal lines,
wherein the touch signal lines comprise first line portions overlapping the touch pads and extending in a second direction intersecting a first direction, second line portions being angled relative to the respective first line portions extending in the first direction and connected to the touch electrodes, and
wherein the first line portion of the touch signal line has a first length in the second direction different from a second length in the second direction of a first line portion of an adjacent touch signal line.

2. The display device of claim 1, wherein lengths of the first line portions in the second direction gradually increase along the first direction towards the side edge of the touch pad area.

3. The display device of claim 1, wherein widths of adjacent ones of the first line portions in the first direction are substantially equal to each other.

4. The display device of claim 1, wherein the at least one dummy electrode is disposed in the touch peripheral area.

5. The display device of claim 1, wherein the dummy electrodes are disposed between adjacent ones of the first line portions.

6. The display device of claim 5, wherein a first distance between adjacent ones of the first line portions is greater than a second distance between adjacent ones of the second line portions.

7. The display device of claim 6, wherein the at least one dummy electrode comprises a plurality of dummy electrodes, and the dummy electrodes are arranged along a direction in which the first line portions extend.

8. The display device of claim 7, wherein the number of the plurality of dummy electrodes is gradually increased along the first direction towards the side edge of the touch pad area.

9. The display device of claim 7, wherein each of the dummy electrodes is aligned with adjacent ones of the second line portions along the first direction.

10. The display device of claim 5, wherein each of the first line portions comprises a plurality of openings arranged along the second direction.

11. The display device of claim 1, wherein the first line portion comprises a first subsidiary line portion and a second subsidiary line portion adjacent to the first subsidiary line portion in the second direction, wherein the first subsidiary line portion protrudes from the second subsidiary line portion in the first direction, and wherein the first subsidiary line portion is aligned with the adjacent second line portion in the first direction.

12. The display device of claim 1, wherein the first line portion is physically separated from the second line portion, and wherein the touch sensing unit further comprises a connection electrode electrically connecting the touch pad with the second line portion.

13. The display device of claim 12, wherein the connection electrode is disposed in a same layer as the touch pads.

14. The display device of claim 12, wherein the touch sensing unit further comprises a dummy metal line aligned with the second line portion along the first direction and electrically separated from the second line portion.

15. The display device of claim 12, wherein the connection electrode is physically connected to the touch pads.

16. The display device of claim 1, further comprising: a first insulating layer disposed between the first line portions and the touch pads, wherein the touch pads are electrically connected to the first line portions through contact holes formed in the first insulating layer, wherein each of the first line portions comprises a metal opening formed in the each of the first line portions, and wherein the touch pads overlap the metal openings, respectively.

17. The display device of claim 1, wherein the touch signal lines comprise first line portions having a serpentine shape overlapping the touch pads, and second line portions angled relative to respective first line portions extending in the first direction and connected to the touch electrodes, and wherein lengths of the first line portions increase gradually along the first direction towards the side edge of the touch pad area.

18. The display device of claim 1, wherein a material of the dummy electrode is the same as a material of the touch signal line.

19. The display device of claim 1, wherein the first line portion of the touch signal line and the at least one dummy electrode are disposed directly on a same layer.

20. A display device comprising:
a display panel having a display area and a non-display area disposed at least partially around the display area; and
a touch sensor disposed on the display panel and including a touch sensor area in the display area and a touch peripheral area in the non-display area adjacent to the touch sensor area,
wherein the touch sensor includes a plurality of touch electrodes disposed in the touch sensor area, a plurality of touch pads arranged in a touch pad area of the touch peripheral area in a first direction, a plurality of touch signal lines electrically connecting the touch electrodes with the touch pads, respectively, and at least one dummy electrode disposed in the touch peripheral area between adjacent ones of the touch signal lines, and
wherein the at least one dummy electrode has at least one dummy opening.

21. The display device of claim 20, wherein the touch signal lines are disposed in the touch peripheral area and comprise first line portions overlapping the touch pads and extending in a second direction intersecting the first direction, and second line portions are inclined relative to the first line portions extending along the first direction and connected to the touch electrodes.

22. The display device of claim 21, wherein the dummy electrode is disposed between adjacent ones of the first line portions, more than one dummy opening is formed, and the dummy openings are arranged along a direction in which the first line portions extend.

23. The display device of claim 20, wherein a material of the dummy electrode is the same as a material of the touch signal line.

24. A display device comprising:
a display panel having a display area and a non-display area disposed at least partially around the display area; and
a touch sensor disposed on the display panel and including a touch sensor area in the display area and a touch peripheral area in the non-display area adjacent to the touch sensor area,
wherein the touch sensor includes a plurality of touch electrodes disposed in the touch sensor area, a plurality of touch pads disposed in a touch pad area of the touch peripheral area, and a plurality of touch signal lines electrically connecting the touch electrodes with the touch pads, respectively, and at least one dummy electrode disposed in the touch peripheral area between adjacent ones of the touch signal lines,
wherein the touch signal lines comprise a plurality of first touch signal lines,
wherein the first touch signal lines comprise first line portions connected to the touch pads, and second lines portions are angled relative to the respective first line portions extending in a first direction and connected to the touch electrodes,
wherein the first line portions comprise first subsidiary line portions overlapping the touch pads, and second subsidiary line portions disposed between the first subsidiary line portions and the second line portions,
wherein the first subsidiary line portion of the first touch signal line has a first length substantially equal to a first length of a first subsidiary line portion of an adjacent first touch signal line, and
wherein the touch sensor unit further comprises a plurality of dummy patterns disposed in the touch peripheral area.

25. The display device of claim 24, wherein widths of adjacent ones of the second subsidiary line portions of the first touch signal lines are substantially equal to each other.

26. The display device of claim 24, wherein widths of adjacent ones of the second subsidiary line portions of the first touch signal lines are different from each other, and wherein widths of the second subsidiary line portions of the first touch signal lines increase gradually along a second direction intersecting the first direction.

27. The display device of claim 24, wherein the second subsidiary line portions have a stair-like shape.

28. The display device of claim 27, wherein the plurality of touch signal lines comprises second touch signal lines, wherein the second touch signal lines comprise third line portions connected to the touch pads, and fourth line portions angled relative to the third line portions extending in the first direction and connected to the touch electrodes, wherein the plurality of dummy patterns have a shape substantially identical to that of the second subsidiary line portions.

29. The display device of claim 24, wherein a material of the dummy electrode is the same as a material of the touch signal line.

* * * * *